US012784789B2

(12) United States Patent
Cho et al.

(10) Patent No.: US 12,784,789 B2
(45) **Date of Patent: *Nov. 3, 2026**

(54) MEMORY DEVICE, OPERATION METHOD OF MEMORY DEVICE, AND PAGE BUFFER INCLUDED IN MEMORY DEVICE

(71) Applicant: Samsung Electronics Co., Ltd., Suwon-si (KR)

(72) Inventors: Yongsung Cho, Hwaseong-si (KR); Min Hwi Kim, Suwon-si (KR); Ji-Sang Lee, Iksan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 83 days.

This patent is subject to a terminal disclaimer.

(21) Appl. No.: 18/971,939

(22) Filed: Dec. 6, 2024

(65) Prior Publication Data

US 2025/0104748 A1 Mar. 27, 2025

Related U.S. Application Data

(63) Continuation of application No. 18/449,864, filed on Aug. 15, 2023, now Pat. No. 12,198,782, which is a (Continued)

(30) Foreign Application Priority Data

Aug. 18, 2021 (KR) ........................ 10-2021-0108966

(51) Int. Cl.

*G11C 7/20* (2006.01)
*G11C 7/06* (2006.01)

(Continued)

(52) U.S. Cl.

CPC ................ *G11C 7/20* (2013.01); *G11C 7/065* (2013.01); *G11C 7/1039* (2013.01); *G11C 7/12* (2013.01)

(58) Field of Classification Search

CPC ......... G11C 7/20; G11C 7/065; G11C 7/1039; G11C 7/12

See application file for complete search history.

(56) References Cited

U.S. PATENT DOCUMENTS 6,963,509 B1 11/2005 Ju
6,996,014 B2 2/2006 Lee et al.

(Continued)

FOREIGN PATENT DOCUMENTS

EP 1134746 A2 9/2001
KR 2013-0034763 A 4/2013

(Continued)

OTHER PUBLICATIONS

U.S. Notice of Allowance dated Apr. 29, 2024 issued in co-pending U.S. Appl. No. 17/888,661.

*Primary Examiner* — Alfredo Bermudez Lozada
(74) *Attorney, Agent, or Firm* — Fish & Richardson P.C.

(57) ABSTRACT

Disclosed is a memory device which includes a memory cell array including memory cells, data latches connected with a sensing node and storing data in a first memory cell of the memory cells, a sensing latch connected with the sensing node, a temporary storage node, a switch connected between the sensing latch and the temporary storage node and configured to operate in response to a temporary storage node setup signal, a first precharge circuit configured to selectively precharge a first bit line corresponding to the first memory cell depending on a level of the temporary storage node, and a control logic circuit configured to control a dump operation between the data latches, the sensing latch, and the temporary storage node. The control logic circuit performs the dump operation from the data latches to the sensing latch while the first precharge circuit selectively precharges the first bit line.

20 Claims, 28 Drawing Sheets

Related U.S. Application Data continuation of application No. 17/888,661, filed on Aug. 16, 2022, now Pat. No. 12,073,915.

(51) Int. Cl.

| | |
|---|---|
| ***G11C 7/10*** | (2006.01) |
| ***G11C 7/12*** | (2006.01) |

(56) References Cited

U.S. PATENT DOCUMENTS

| | | | | |
|---|---|---|---|---|
| 7,257,047 | B2 | 8/2007 | Kim | |
| 7,724,573 | B2 | 5/2010 | Tokiwa | |
| 8,811,088 | B2 | 8/2014 | Joo et al. | |
| 9,779,824 | B2 | 10/2017 | Missiroli | |
| 11,139,021 | B2 | 10/2021 | Baek et al. | |
| 12,198,782 | B2 * | 1/2025 | Cho | G11C 16/10 |
| 2007/0177434 | A1 | 8/2007 | Mo et al. | |
| 2013/0083607 | A1 | 4/2013 | Joo et al. | |
| 2017/0148518 | A1 | 5/2017 | Kadowaki | |
| 2018/0096718 | A1 | 4/2018 | Kim et al. | |
| 2019/0019561 | A1 | 1/2019 | Lee et al. | |
| 2021/0158874 | A1 * | 5/2021 | Jang | G06F 12/0246 |

FOREIGN PATENT DOCUMENTS

| | | | |
|---|---|---|---|
| KR | 20160038160 | A | 4/2016 |
| KR | 20200098009 | A | 8/2020 |
| KR | 20200107024 | A | 9/2020 |
| KR | 20200117746 | A | 10/2020 |
| KR | 2021-0021222 | A | 2/2021 |

* cited by examiner

MEMORY DEVICE, OPERATION METHOD OF MEMORY DEVICE, AND PAGE BUFFER INCLUDED IN MEMORY DEVICE

CROSS-REFERENCE TO RELATED APPLICATIONS

This application is a continuation of U.S. application Ser. No. 18/449,864, filed on Aug. 15, 2023, which is a continuation of U.S. application Ser. No. 17/888,661, filed on Aug. 16, 2022, which claims priority under 35 U.S.C. § 119 to Korean Patent Application No. 10-2021-0108966 filed on Aug. 18, 2021, in the Korean Intellectual Property Office, the disclosures of each of which are incorporated by reference herein in their entireties.

BACKGROUND

Various example embodiments described herein relate to a semiconductor memory, and more particularly, relate to a memory device and/or an operation method thereof.

A semiconductor memory device may be classified as a volatile memory device, in which stored data disappear when a power supply is turned off, such as a static random access memory (SRAM) and/or a dynamic random access memory (DRAM), or a nonvolatile memory device, in which stored data are retained even when a power supply is turned off, such as at least one of a flash memory device, a phase-change RAM (PRAM), a magnetic RAM (MRAM), a resistive RAM (RRAM), or a ferroelectric RAM (FRAM).

The flash memory device is being widely used as a high-capacity storage medium. The flash memory device stores data in memory cells by repeatedly performing a program step in which a program voltage is applied to the memory cells and a verify step in which program states of the memory cells are verified. The above various operations that the flash memory device performs to store data in memory cells may cause an increase in a time taken to perform a program operation.

SUMMARY

Some example embodiments provide a memory device with improved performance, an operation method of the memory device, and/or a page buffer included in the memory device.

According to some example embodiment, a memory device includes a memory cell array that includes a plurality of memory cells, a plurality of data latches that are connected with a sensing node and configured to store data that is to be stored in a first memory cell of the plurality of memory cells, a sensing latch that is connected with the sensing node, a temporary storage node, a switch that is connected between the sensing latch and the temporary storage node and configured to operate in response to a temporary storage node setup signal, a first precharge circuit configured to selectively precharge a first bit line corresponding to the first memory cell depending on a level of the temporary storage node, and a control logic circuit configured to control a dump operation between the plurality of data latches, the sensing latch, and the temporary storage node. The control logic circuit is configured to perform a dump operation from the plurality of data latches to the sensing latch while the first precharge circuit selectively precharges the first bit line.

According to some example embodiments, an operation method of a memory device which is configured to selectively perform a verify operation on memory cells includes storing first target state information at a temporary storage node of the first page buffer, the first target state information generated based on a plurality of data latches of a first page buffer connected with a first bit line, selectively precharging the first bit line based on the first target state information of the temporary storage node, storing second target state information, the second target state information generated based on the plurality of data latches, the second target state information stored in a sensing latch of the first page buffer, and verifying a program state of a memory cell corresponding to the first bit line. The selectively precharging of the first bit line and the storing of the second target state information in the sensing latch are simultaneously performed.

According to some example embodiments, a page buffer included in a memory device includes a plurality of data latches that are connected with a sensing node, a sensing latch, a switch that is connected with the sensing latch, a temporary storage node that is configured to store a value of the sensing latch through the switch, a first transistor that is connected between a power supply voltage and a first node and configured to operate in response to a level of the temporary storage node, a second transistor that is connected between a second node and a ground node and configured to operate in response to the level of the temporary storage node, a third transistor that is connected between the first node and the sensing node and configured to operate in response to a bit line setup signal, a fourth transistor that is connected between the second node and the sensing node and configured to operate in response to a sensing node ground signal, a fifth transistor that is connected between the first node and the second node and configured to operate in response to a bit line ground signal, and a sixth transistor connected between the first node and the first bit line, and configured to operate in response to a selective bit line clamp signal.

BRIEF DESCRIPTION OF THE FIGURES

The above and other objects and features of the present disclosure will become apparent by describing in detail various example embodiments thereof with reference to the accompanying drawings.

FIG. 16 is a circuit diagram illustrating a cache latch included in a first page buffer of

FIG. 15.

DETAILED DESCRIPTION

Below, various example embodiments of the present disclosure may be described in detail and clearly to such an extent that an ordinary one in the art more easily implements various example embodiments.

Figure 1:
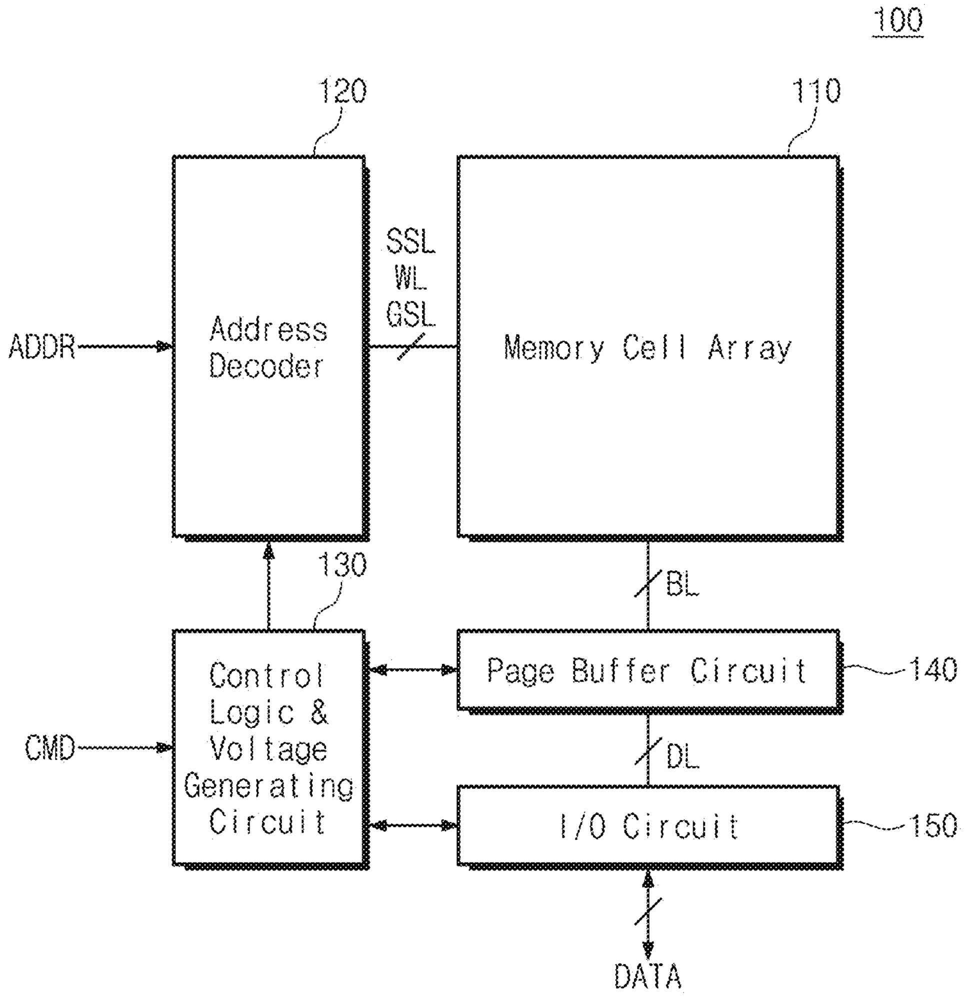
FIG. 1 illustrates a memory device according to some example embodiments.

FIG. 1 illustrates a memory device according to some example embodiments.

Referring to FIG. 1, a memory device 100 may include a memory cell array 110, an address decoder 120, a control logic and voltage generating circuit 130, a page buffer circuit 140, and an input/output circuit 150. In some example embodiments, the memory device 100 may be a nonvolatile memory device such as a NAND flash memory device, but example embodiments are not limited thereto.

The memory cell array 110 may include a plurality of memory blocks. Each of the plurality of memory blocks may be connected with string selection lines SSL, word lines WL, ground selection lines GSL, and bit lines BL. A configuration of the plurality of memory blocks will be described in detail with reference to FIG. 2.

The address decoder 120 may receive an address ADDR from an external device (e.g., a memory controller and/or a host). The address decoder 120 may decode the address ADDR and may control and/or drive voltages of one or more of the string selection lines SSL, the word lines WL, and the ground selection lines GSL based on a decoding result. For example, the address decoder 120 may receive various operation voltages from the control logic and voltage generating circuit 130, and may provide a corresponding operation voltage to each of the string selection lines SSL, the word lines WL, and the ground selection lines GSL based on the decoded result.

The control logic and voltage generating circuit 130 may generate various operation voltages (e.g., one or more of a plurality of program voltages, a plurality of verification voltages, a plurality of read voltages, and a plurality of erase voltages) necessary for/used for the memory device 100 to operate. The control logic and voltage generating circuit 130 may receive a command CMD from the external device (e.g., a memory controller and/or a host). The control logic and voltage generating circuit 130 may control various components of the memory device 100 based on the received command CMD. Below, for convenience of description, the control logic and voltage generating circuit 130 is referred to as a "control logic circuit".

The page buffer circuit 140 may be connected with the memory cell array 110 through the bit lines BL. The page buffer circuit 140 may receive data "DATA" from the input/output circuit 150 and may temporarily store the received data "DATA", e.g. at least until or up until the received data "DATA" is stored in memory cell array 110. The page buffer circuit 140 may control voltages of the bit lines BL such that the temporarily stored data "DATA" are stored in the memory cell array 110. Alternatively or additionally, the page buffer circuit 140 may read the data "DATA" stored in the memory cell array 110 by sensing changes in voltages of the bit lines BL. The page buffer circuit 140 may provide the read data "DATA" to the input/output circuit 150.

The input/output circuit 150 may exchange the data "DATA" with the external device (e.g., a memory controller). In some example embodiments, in synchronization with a data strobe signal, the input/output circuit 150 may output the data "DATA" to the external device and/or may receive the data "DATA" from the external device.

In some example embodiments, the memory device 100 according to example embodiments may store data in the memory cell array 110 through a plurality of program loops. Each of the plurality of program loops may include a program step in which a program voltage is applied to a selected word line, and a verify step in which a verification voltage is applied to the selected word line. In one verify step, at least one program state may be verified. In this case, the memory device 100 may perform an operation (e.g., a target dump operation) for selecting a target program state during a bit line precharge operation. In this case, a total program time of the memory device 100 may be shortened. An operation of the memory device 100 according to example embodiments will be described with reference to accompanying drawings.

Figure 2:
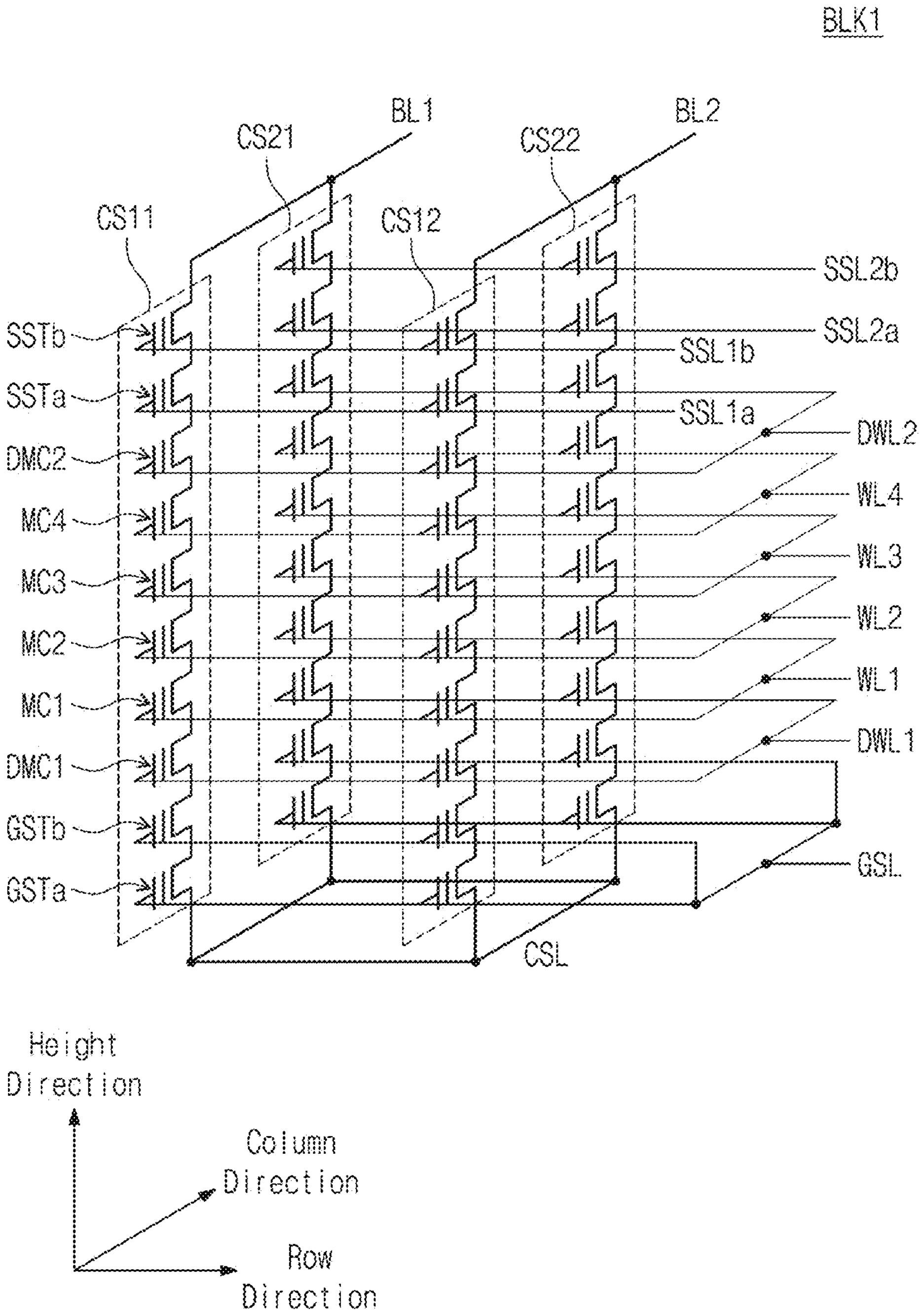
FIG. 2 is a diagram illustrating a first memory block of a plurality of memory blocks included in a memory cell array in FIG. 1.

FIG. 2 is a diagram illustrating a first memory block of a plurality of memory blocks included in a memory cell array in FIG. 1. A first memory block BLK1 will be described with reference to FIG. 2. However, it may be understood that the remaining memory blocks included in the memory cell array 110 have a structure similar to or the same as that of the first memory block BLK1, and/or may have a different structure, and example embodiments are not limited thereto.

Referring to FIGS. 1 and 2, the first memory block BLK1 may include a plurality of cell strings CS11, CS12, CS21, and CS22. The plurality of cell strings CS11, CS12, CS21, and CS22 may be arranged in a row direction and a column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may include a charge trap flash (CTF) memory cell, but example embodiments are not limited thereto. The plurality of cell transistors may be stacked in a height direction that is a direction perpendicular to a plane (e.g., a semiconductor substrate (not illustrated)) defined by the row direction and the column direction.

The plurality of cell transistors of each cell string may be connected in series, e.g. from source of one transistor to drain of another transistor, between the corresponding bit line (e.g., BL1 or BL2) and a common source line CSL. For example, the plurality of cell transistors may include string selection transistors SSTa and SSTb, dummy memory cells DMC1 and DMC2 that are not electrically active but may provide structural support, memory cells MC1 to MC4, and ground selection transistors GSTa and GSTb. The string selection transistors SSTa and SSTb that are connected in series may be provided or connected between the serially-connected memory cells MC1 to MC4 and the corresponding bit line (e.g., BL1 and BL2). The ground selection transistors GSTa and GSTb that are connected in series may be provided or connected between the serially-connected memory cells MC1 to MC4 and the common source line CSL. In some example embodiments, the second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

Memory cells placed at the same height from among the memory cells MC1 to MC4 of the plurality of cell strings CS11, CS12, CS21, and CS22 may share the same word line. For example, the first memory cells MC1 of the plurality of cell strings CS11, CS12, CS21, and CS22 may be placed at the same height from the semiconductor substrate (not illustrated) and may share a first word line WL1. The second memory cells MC2 of the plurality of cell strings CS11, CS12, CS21, and CS22 may be placed at the same height from the semiconductor substrate (not illustrated) and may share a second word line WL2. Likewise, the third memory cells MC3 of the plurality of cell strings CS11, CS12, CS21, and CS22 may be placed at the same height from the semiconductor substrate (not illustrated) and may share a third word line WL3, and the fourth memory cells MC4 of the plurality of cell strings CS11, CS12, CS21, and CS22 may be placed at the same height from the semiconductor substrate (not illustrated) and may share a fourth word line WL4.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1*b*, and the string selection transistors SSTa of the cell strings CS11 and CS12 may share a string selection line SSL1*a*. The string selection transistors SSTb of the cell strings CS21 and CS22 may be connected with a string selection line SSL2*b*, and the string selection transistors SSTa of the cell strings CS21 and CS22 may be connected with a string selection line SSL2*a*.

Although not illustrated in FIG. 2, string selection transistors placed at the same row from among the string selection transistors SSTa and SSTb of the plurality of cell strings CS11, CS12, CS21, and CS22 may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

Ground selection transistors placed at the same height and the same row from among the ground selection transistors GSTa and GSTb of the plurality of cell strings CS11, CS12, CS21, and CS22 may be connected with the same ground selection line. For example, the ground selection transistors GSTb of the cell strings CS11 and CS12 may be connected with a first ground selection line, and the ground selection transistors GSTa of the cell strings CS11 and CS12 may share a second ground selection line. The ground selection transistors GSTb of the cell strings CS21 and CS22 may be connected with a third ground selection line, and the ground selection transistors GSTa of the cell strings CS21 and CS22 may be connected with a fourth ground selection line.

As illustrated in FIG. 2, the ground selection transistors GSTb and GSTa of the plurality of cell strings CS11, CS12, CS21, and CS22 may share the same ground selection line GSL. Alternatively or additionally, at least some ground selection transistors placed at the same height from among the ground selection transistors GSTb and GSTa of the plurality of cell strings CS11, CS12, CS21, and CS22 may share the same ground selection line. Alternatively or additionally, ground selection transistors placed at the same row from among the ground selection transistors GSTb and GSTa of the plurality of cell strings CS11, CS12, CS21, and CS22 may share the same ground selection line.

Although not illustrated in FIG. 2, each of the plurality of cell strings CS11, CS12, CS21, and CS22 of the first memory block BLK1 may further include an erase control transistor. The erase control transistors of the plurality of cell strings CS11, CS12, CS21, and CS22 may be placed at the same height from the semiconductor substrate and may be connected with the same erase control line. For example, in each of the plurality of cell strings CS11, CS12, CS21, and CS22, the erase control transistor may be interposed between the ground selection transistor GSTa and the common source line CSL. Alternatively, the erase control transistor may be interposed between the corresponding bit line BL1 or BL2 and the string selection transistor SSTb. However, example embodiments are not limited thereto.

In some example embodiments, the first memory block BLK1 illustrated in FIG. 2 is only an example. The number of cell strings may increase or decrease, and the number of rows of cell strings and the number of columns of cell strings may increase or decrease depending on the number of cell strings. Additionally or alternatively, in the first memory block BLK1, the number of cell transistors (e.g., GST, MC, DMC, and SST) may increase or decrease, and the height of the first memory block BLK1 may increase or decrease depending on the number of cell transistors. Additionally or alternatively, the number of lines (e.g., GSL, WL, DWL, and SSL) connected with cell transistors may increase or decrease depending on the number of cell transistors. In some example embodiments, as the number of cell transistors of the first memory block BLK1 increases, the first memory block BLK1 may have a multi-stack structure.

Figure 3:
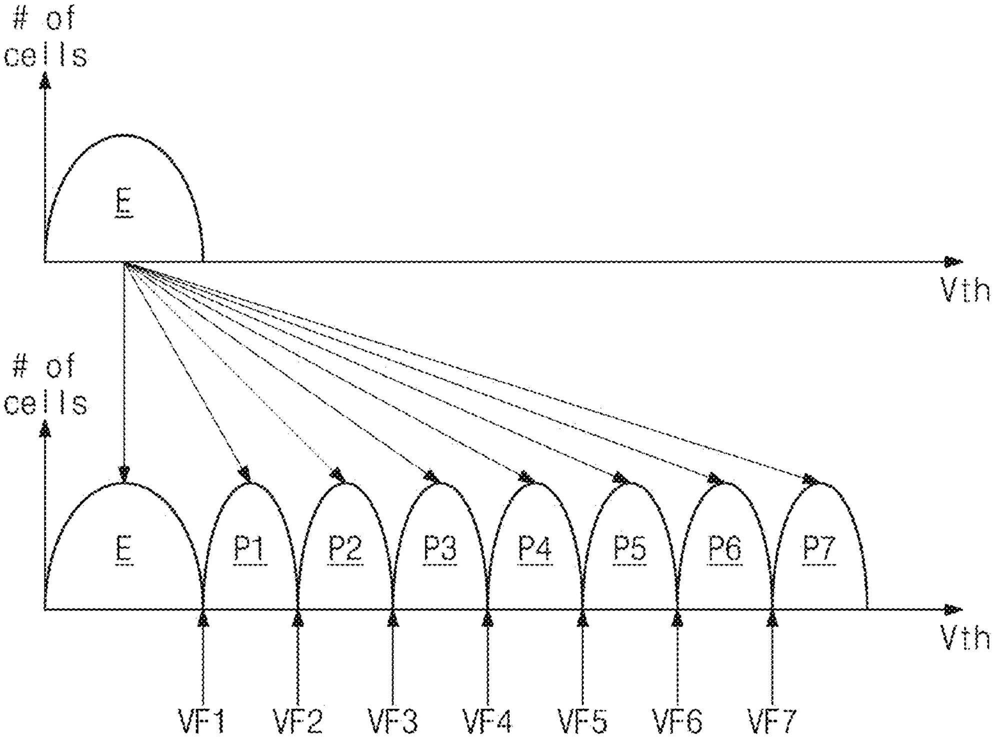
FIG. 3 is a distribution diagram for describing a program operation of a memory device of FIG. 1.
Figure 4:
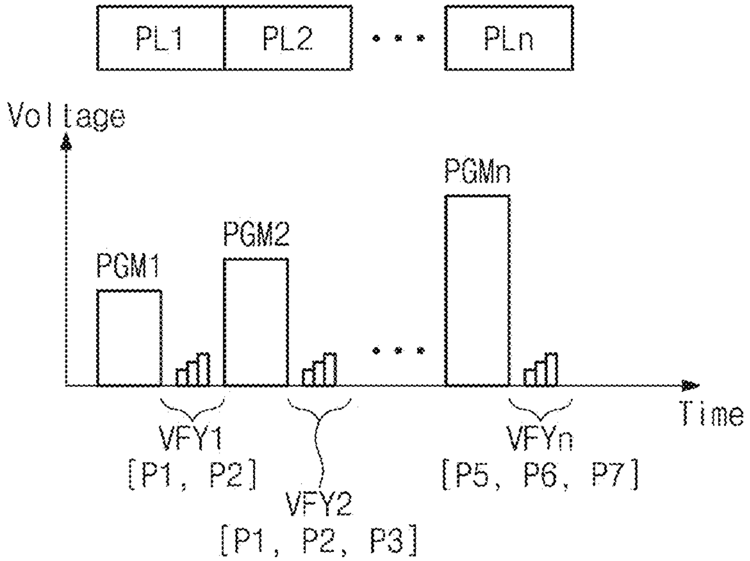
FIG. 4 is a timing diagram for describing a program operation of a memory device.

FIG. 3 is a distribution diagram for describing a program operation of a memory device of FIG. 1. FIG. 4 is a timing diagram for describing a program operation of a memory device. In some example embodiments, in the distribution diagrams of FIG. 3, a horizontal axis represents a threshold voltage of a memory cell, and a vertical axis represents the number of memory cells, e.g. the number of memory cells within a block and/or within a semiconductor device have the corresponding threshold voltage. In the timing diagram of FIG. 4, a horizontal axis represents a time, and a vertical axis represents a word line voltage applied to a selected word line. For convenience of description, it is assumed that each memory cell is a triple level cell storing 3-bit data, e.g. three bits such as "010" may be store within a memory cell. However, example embodiments are not limited thereto. For example, each memory cell may be a single level cell (SLC) storing one bit, or a multi-level cell (MLC) storing, e.g., two cells, or a quad level cell (QLC) storing two or more bits. As described below in more detail, a number of latches LAT_1 to LAT_3 may be determined based on the number of bits that each memory cell may store; however, example embodiments may not be limited thereto A mapping between threshold voltages and logical bits may be predefined and/or dynamically defined. Additionally or alternatively, memory cells such as memory cells MC1 to MC4 having a threshold voltage less than zero volts may be in an erased state, and memory cells such as memory cells MC1 to MC4 having a threshold voltage greater than zero volts may be in a programmed state; however, example embodiments are not limited thereto. For example, the seventh program state P7 may correspond to a bit value of "000" or "111"; example embodiments are not limited thereto.

Referring to FIGS. 1 and 3, the memory device 100 may store and/or program data in memory cells by changing threshold voltages of a plurality of memory cells (e.g., MC1 to MC4 of FIG. 2) included in the memory cell array 110.

For example, the memory device 100 may perform a program operation on the memory cells based on data to be stored, such as memory cells of an erase state "E" has one of the erase state "E" and a plurality of program states P1 to P7. In some example embodiments, the program operation may be performed in units of word lines and/or in units of pages.

In some example embodiments, the memory device 100 may perform the program operation based on an incremental step pulse programming (ISPP) scheme. For example, as illustrated in FIG. 4, the memory device 100 may perform the program operation through a plurality of program loops PL1 to PLn. Each of the plurality of program loops PL1 to PLn may include a program step of applying a program voltage to a selected word line and/followed by a verify step of verifying program states of memory cells.

For example, the memory device 100 may perform the first program loop PL1. The first program loop PL1 may include a first program step and a first verify step VFY1. In the first program step, a first program voltage PGM1 may be applied to a selected word line to change threshold voltages of memory cells. In the first verify step VFY1, one or more of a plurality of verification voltages VF1 to VF7 may be sequentially applied to the selected word line to verify program states of the memory cells.

Afterwards, the memory device 100 may perform the second program loop PL2. The second program loop PL2 may include a second program step and/followed by a second verify step VFY2. In the second program step, a second program voltage PGM2 may be applied to the selected word line to change threshold voltages of the memory cells. In the second verify step VFY2, one or more of the plurality of verification voltages VF1 to VF7 may be sequentially applied to the selected word line to verify program states of the memory cells.

Afterwards, the memory device 100 may perform the n-th program loop PLn. The n-th program loop PLn may include an n-th program step and/followed by an n-th verify step VFYn. In the n-th program step, an n-th program voltage PGMn may be applied to the selected word line to change threshold voltages of the memory cells. In the n-th verify step VFYn, one or more of the plurality of verification voltages VF1 to VF7 may be sequentially applied to the selected word line to verify program states of the memory cells.

In some example embodiments, as a program loop is repeatedly performed, a magnitude of a program voltage that is applied to a selected word line may stay the same or may increase. For example, the second program voltage PGM2 may be higher than the first program voltage PGM1 as much as the given level. The n-th program voltage PGMn may be higher than a program voltage of an (n−1)-th program loop as the given level. In each program loop, a program voltage may be set to a given level or may be variable depending on states of memory cells.

In some example embodiments, memory cells may be selectively verified in a verify step depending on a program loop. For example, in the first verify step VFY1 of the first program loop PL1, memory cells corresponding to the first and second program states P1 and P2 may be verified. In this case, the first verify step VFY1 may be performed by selectively precharging bit lines connected with the memory cells corresponding to the first and second program states P1 and P2 and sequentially applying the first and second verification voltages VF1 and VF2 to the selected word line. In more detail, to verify memory cells corresponding to the first program state P1, the memory device 100 may selectively precharge a bit line connected with a memory cell corresponding to the first program state P1 and may apply the first verification voltage VF1 for verifying the first program state P1 to the selected word line. Afterwards, to verify memory cells corresponding to the second program state P2, the memory device 100 may selectively precharge a bit line connected with a memory cell corresponding to the second program state P2 and may apply the second verification voltage VF2 for verifying the second program state P2 to the selected word line.

Below, to describe various example embodiments of inventive concepts, more easily, the term "first to seventh program state verifications" are used. The first program state verification may indicate an operation of verifying memory cells, which correspond to the first program state P1 or are to be programmed to the first program state P1, from among memory cells connected with a selected word line. Likewise, the second to fourth program state verifications may indicate operations of verifying memory cells, which correspond to the second to seventh program states P2 to P7 or are to be programmed to the second to seventh program states P2 to P7, from among the memory cells connected with the selected word line. For example, one verify step included in one program loop may include one or more of the first to seventh program state verifications.

In some example embodiments, an execution order of program state verifications included in one verify step from among the first to seventh program state verifications may be variously changed. For example, in one verify step, when the fifth to seventh program state verifications are performed, the fifth to seventh program state verifications may be performed in the order of the fifth program state verification, the sixth program state verification, and the seventh program state verification, in the order of the seventh program state verification, the sixth program state verification, and the fifth program state verification, or in an arbitrary order. The terms described above are to describe embodiments of example embodiments easily, and it may be understood that the scope and spirit of example embodiments are not limited by the terms.

In the second verify step VFY2 of the second program loop PL2, the first to third program state verifications may be performed. For example, in the second verify step VFY2, the first to third program state verifications may be sequentially performed on memory cells having the first to third program states P1, P2, and P3 from among the memory cells connected with the selected word line. Likewise, in the n-th verify step VFYn of the n-th program loop PLn, the fifth to seventh program state verifications may be performed. For example, in the n-th verify step VFYn, the fifth to seventh program state verifications may be sequentially performed on memory cells having the fifth to seventh program states P5, P6, and P7 from among the memory cells connected with the selected word line.

As described above, in the verify steps VFY1 to VFYn of the plurality of program loops PL1 to PLn, a verification operation may be performed on some of memory cells connected with a selected word line, depending on a relevant program state. In this case, only bit lines corresponding to some memory cells may be selectively precharged to perform the verification operation on some memory cells.

For example, the memory device 100 may perform the fifth to seventh program state verifications in the n-th verify step VFYn. In this case, in the seventh program state verification, the memory device 100 may selectively precharge bit lines connected with memory cells corresponding to the seventh program state P7, through a dump operation of latches included in the page buffer circuit 140. After the seventh program state verification is completed, the memory device 100 may perform the sixth program state verification.

In some example embodiments, the memory device 100 according to example embodiments may perform a dump operation for selectively precharging bit lines connected with memory cells corresponding to the sixth program state P6 during a bit line precharge operation in the seventh program state verification. In other words, during a bit line precharge period of a current program state verification, a dump operation for selecting a bit line to be precharged in a next program state verification may be performed. In this case, a total program time may be shortened. An operation of the memory device 100 or the page buffer circuit 140 according to example embodiments will be more fully described with reference to the following drawings.

In some example embodiments, the above program scheme is only an example, and example embodiments are not limited thereto. For example, the memory device 100 may perform a word line or page-based program operation in various schemes such as a shadow program scheme, a fast program scheme, and a reprogram scheme.

Figure 5:
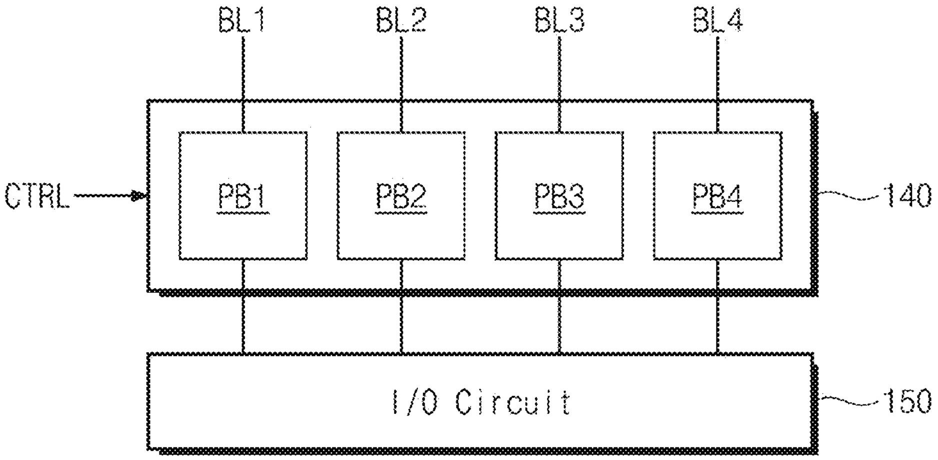
FIG. 5 is a block diagram illustrating the page buffer circuit 140 of FIG. 1.

FIG. 5 is a block diagram illustrating the page buffer circuit 140 of FIG. 1. Referring to FIGS. 1 and 5, the page buffer circuit 140 may include a plurality of page buffers PB1, PB2, PB3, and PB4. The plurality of page buffers PB1, PB2, PB3, and PB4 may be connected with a plurality of bit lines BL1, BL2, BL3, and BL4.

The plurality of page buffers PB1, PB2, PB3, and PB4 may receive data from the input/output circuit 150 and may temporarily store the received data. A program operation may be performed on memory cells connected with the plurality of bit lines BL1, BL2, BL3, and BL4, based on the data temporarily stored in the plurality of page buffers PB1, PB2, PB3, and PB4.

The plurality of page buffers PB1, PB2, PB3, and PB4 may perform various operations (e.g., a dump operation and/or a sensing operation) in response to a control signal CTRL from the control logic and voltage generating circuit 130. A structure and an operation of a page buffer will be described in detail with reference to the following drawings.

Figure 6:
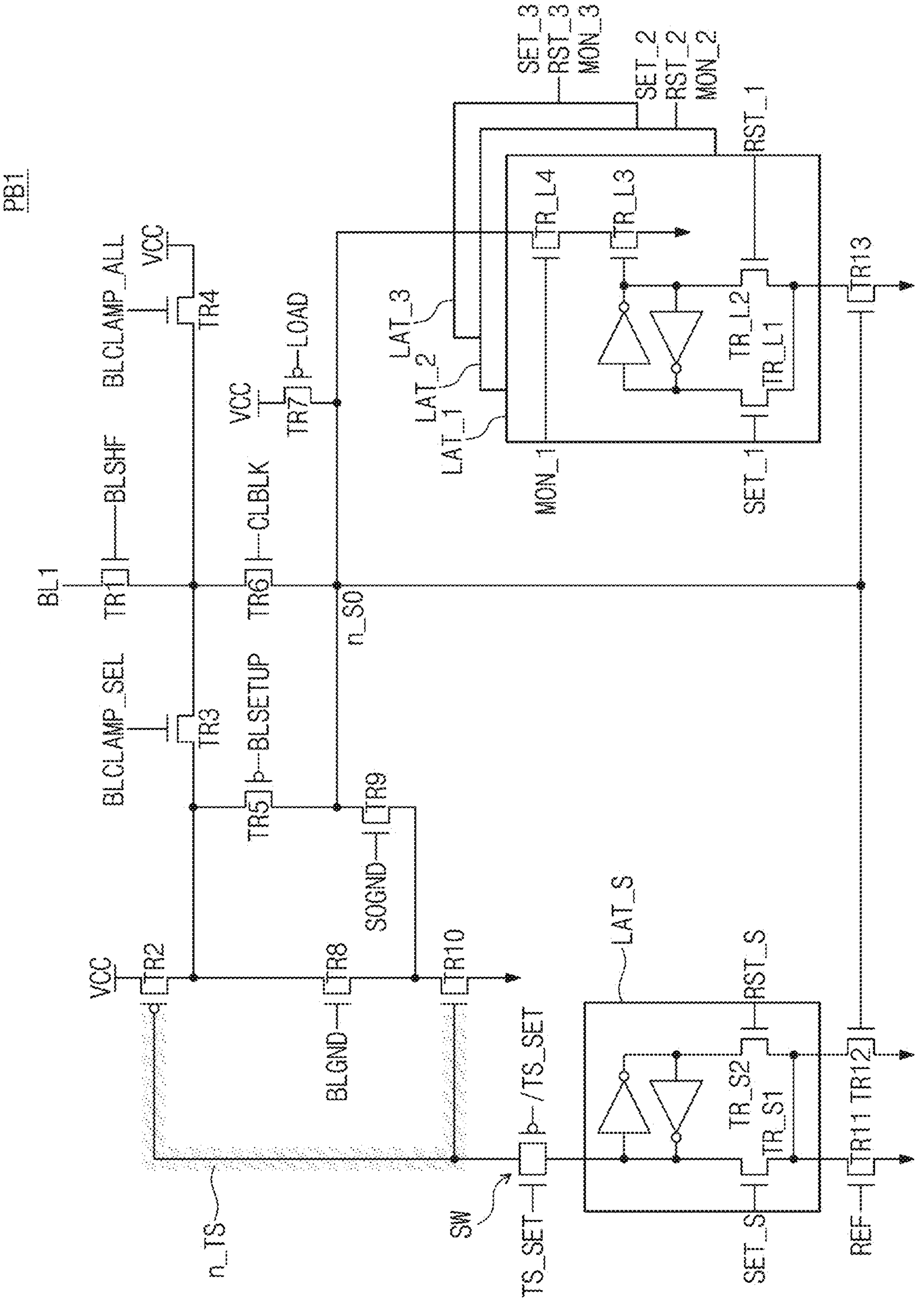
FIG. 6 is a circuit diagram illustrating a first page buffer of FIG. 5.

FIG. 6 is a circuit diagram illustrating a first page buffer of FIG. 5. For convenience of description, the first page buffer PB1 of the plurality of page buffers PB1 to PB4 will be described with reference to FIG. 6, but the remaining page buffers PB2, PB3, and PB4 may have a structure that is the same as or similar to that of the first page buffer PB1, with the same or similar components arranged and connected in the same or similar manner. In some example embodiments, various signals (e.g., signals for controlling the first page buffer PB1) to be described below may be included in the control signal CTRL described with reference to FIG. 5.

Referring to FIGS. 1, 5, and 6, the first page buffer PB1 may include a plurality of transistors TR1 to TR13, a switch SW, a sensing latch LAT_S, and first to third latches LAT_1 to LAT_3. The number of latches LAT_1 to LAT_3 may be based on the number of bits that each respective memory cell may store; however, example embodiments are not limited thereto. The first to third latches LAT_1 to LAT_3 may be referred to as data latches. In some example embodiments, the structure of the first page buffer PB1 illustrated in FIG. 6 is only an example, and example embodiments are not limited thereto. It may be understood that the structure of the first page buffer PB1 including the number of and/or structure of various components, and/or the arrangement of and/or connections of various components, may be variously changed or modified without departing from the technical idea of various example embodiments.

For example, FIG. 6 illustrates various transistors as NMOS transistors and PMOS transistors; however, this is for illustrative purposes only. For example, any or all of the plurality of transistors TR1 to TR13 may be NMOS transistors having the same or different electrical properties such as threshold voltages, or any or all of the plurality of transistors TR1 to TR13 may be PMOS transistors having the same or different electrical properties such as threshold voltages; example embodiments are not limited thereto.

The first transistor TR1 may be connected between the first bit line BL1 and a first terminal of the sixth transistor TR6 and may operate in response to/be gated by a bit line shutoff signal BLSHF. The second transistor TR2 may be connected between a power supply voltage VCC and a first terminal of the third transistor TR3 and may operate in response to/be gated by a voltage of a temporary storage node n_TS. The third transistor TR3 may be connected between a first terminal of the second transistor TR2 and a connection node of the first and sixth transistors TR1 and TR6 and may operate in response to/be gated by a selective bit line clamp signal BLCLAMP_SEL. The fourth transistor TR4 may be connected between the connection node of the first and sixth transistors TR1 and TR6 and the power supply voltage VCC and may operate/be gated in response to an all bit line clamp signal BLCLAMP_ALL. The fifth transistor TR5 may be connected between a connection node of the second and third transistors TR2 and TR3 and a sensing node n_SO and may operate in response to/be gated by a bit line setup signal BLSETUP. The sixth transistor TR6 may be connected between the first transistor TR1 and the sensing node n_SO and may operate in response to/be gated by a blocking signal CLBLK. The seventh transistor TR7 may be connected between the sensing node n_SO and the power supply voltage VCC and may operate in response to/be gated by a load signal LOAD. The eighth transistor TR8 may be connected between the connection node of the second and third transistors TR2 and TR3 and a connection node of the ninth and tenth transistors TR9 and TR10 and may operate in response to/be gated by a bit line ground signal BLGND. The ninth transistor TR9 may be connected between a connection node of the eighth and tenth transistors TR8 and TR10 and the sensing node n_SO and may operate in response to/be gated by a sensing node ground signal SOGND. The tenth transistor TR10 may be connected between a connection node of the eighth and ninth transistors TR8 and TR9 and a ground voltage and may operate in response to/be gated by a level of the temporary storage node n_TS. The eleventh transistor TR11 may be connected between the sensing latch LAT_S and the ground voltage and may operate in response to/be gated by a refresh signal REF. The twelfth transistor TR12 may be connected between the sensing latch LAT_S and the ground voltage and may operate in response to/be gated by a level of the sensing node n_SO. The thirteenth transistor TR13 may be connected between the first to third latches LAT_1 to LAT_3 and the ground voltage and may operate in response to/be gated by the level of the sensing node n_SO.

In some example embodiments, each of the first, third, fourth, sixth, and eighth to thirteenth transistors TR1, TR3, TR4, TR6, TR8, TR9, TR10, TR11, TR12, and TR13 may be an NMOS transistor, and each of the second, fifth, and seventh transistors TR2, TR5, and TR7 may be a PMOS transistor; however, example embodiments are not limited thereto.

The switch SW may be connected between the temporary storage node n_TS and the sensing latch LAT_S and may operate in response to temporary storage node setup signals (hereinafter referred to as "temporary setup signals") TS_SET and/TS_SET. In some example embodiments, the switch SW may be implemented in the form of a transmission gate in which an NMOS transistor and a PMOS transistor are connected in parallel. However, example embodiments are not limited thereto. For example, the switch SW may be implemented with various elements configured to electrically connect or disconnect the sensing latch LAT_S with or from the temporary storage node n_TS in response to the temporary setup signals TS_SET and/TS_SET.

The sensing latch LAT_S may be connected between a connection node of the eleventh and twelfth transistors TR11 and TR12 and the switch SW. The sensing latch LAT_S may include two (cross-coupled) inverters and first and second sensing transistors TR_S1 and TR_S2. Either or both of the first and second sensing transistors TR_S1 and TR_2 may be NMOS transistors; however, example embodiments are not limited thereto. The two inverters may have a cyclic (or latch) structure in which an input and an output of one inverter are respectively connected with an output and an input of the other inverter. A first node between/of the two inverters may be connected with the switch SW. The first sensing transistor TR_S1 may be connected between the first node between or of the two inverters and the connection node of the eleventh and twelfth transistors TR11 and TR12 and may operate in response to a sensing set signal SET_S. The second sensing transistor TS_S2 may be connected between or of a second node between the two inverters and the connection node of the eleventh and twelfth transistors TR11 and TR12 and may operate in response to a sensing reset signal RST_S. The sensing latch LAT_S may be configured to store a level of the connection node of the eleventh and twelfth transistors TR11 and TR12 in response to the sensing set signal SET_S and the sensing reset signal RST_S.

The first latch LAT_1 may be connected between the sensing node n_SO and the thirteenth transistor TR13. The first latch LAT_1 may include two (cross-coupled) inverters and first to fourth latch transistors TR_L1 to TR_L4. The two inverters may have a cyclic (or latch) structure in which an input and an output of one inverter are respectively connected with an output and an input of the other inverter. The first latch transistor TR_L1 may be connected between a first node of or between the two inverters and the thirteenth transistor TR13 and may operate in response to a first set signal SET_1. The second latch transistor TR_L2 may be connected between a second node of or between the two inverters and the thirteenth transistor TR13 and may operate in response to a first reset signal RST_1. The third and fourth latch transistors TR_L3 and TR_L4 may be connected in series between the sensing node n_SO and the ground voltage, the third latch transistor TR_L3 may operate in response to a level of the second node between the two inverters, and the fourth latch transistor TR_L4 may operate in response to a first latch control signal MON_1. The first latch LAT_1 may be configured to store data in response to the control signals SET_1, RST_1, and MON_1 and/or to output the stored data in response to the control signals SET_1, RST_1, and MON_1.

The second latch LAT_2 may operate in response to control signals SET_2, RST_2, and MON_2 and may have a structure and/or connections the same as or similar to that of the first latch LAT_1; the third latch LAT_3 may operate in response to control signals SET_3, RST_3, and MON_3 and may have a structure similar to that of the first latch LAT_1. For convenience of description and brevity of drawing, thus, additional description will be omitted to avoid redundancy.

The first page buffer PB1 illustrated in FIG. 6 is only an example for describing example various example embodiments easily, and example embodiments are not limited thereto. Various control signals (e.g., one or more of BLSHF, BLCLAM_SEL, BLCLAMP_ALL, BLSETUP, BLGND, SOGND, CLBLK, LOAD, SET_S, RST_S, REF, SET_1, RST_1, MON_1, SET_2, RST_2, MON_3, SET_3, RST_3, and MON_3) illustrated in FIG. 6 are signals for controlling the first page buffer PB1 of the memory device 100, and, unless otherwise defined in the detailed description, additional description will be omitted to avoid redundancy. However, example embodiments are not limited thereto. For example, control signals necessary to, or desired to, implement various example embodiments of example embodiments will be more clearly described in the detailed description.

In some example embodiments, while the memory device 100 performs a verify step, the sensing latch LAT_S may store information (hereinafter referred to as "target state information") for selecting a bit line to be precharged. In the verify step, the target state information stored in the sensing latch LAT_S may be transferred to the temporary storage node n_TS through the switch SW, and the first bit line BL1 may be selectively precharged depending on a level of the temporary storage node n_TS.

A conventional page buffer circuit does not include the switch SW and the temporary storage connection/temporary storage node n_TS, and a bit line is selectively precharged based on the target state information stored in the sensing latch LAT_S. In this case, during precharging the bit line, because the target state information should be maintained in the sensing latch LAT_S, next target state information for a next program state verification is unable to be dumped to the sensing latch LAT_S. For example, the next target state information for the next program state verification is dumped after a current program state verification is completed. In this case, the dump operation causes an increase in a time necessary for the verify step or an increase in a total program time.

In contrast, according to example embodiments, the target state information stored in the sensing latch LAT_S may be transferred to the temporary storage node n_TS through the switch SW, and the first bit line BL1 may be selectively precharged depending on a level of the temporary storage node n_TS. In this case, during precharging the first bit line BL1, because the sensing latch LAT_S does not or does not need to maintain the target state information, the next target state information for the next program state verification may be dumped to/loaded on the sensing latch LAT_S.

For example, when the selective bit line clamp signal BLCLAMP_SEL is activated, the third transistor TR3 may be turned on. In this case, the first bit line BL1 may be selectively precharged depending on a level of the temporary storage node n_TS. In addition, next target state information for a next program state verification may be dumped to the sensing latch LAT_S based on data of the first to third latches LAT_1, LAT_2, and LAT_3. For example, while the selective bit line clamp signal BLCLAMP_SEL is activated, next target state information may be dumped to the sensing latch LAT_S. According to the above descriptions, the bit line precharge operation and the dump operation may be performed concurrently or at least partially at the same time or in parallel, and thus, a total program time of the memory device 100 may be shortened.

Figure 7:
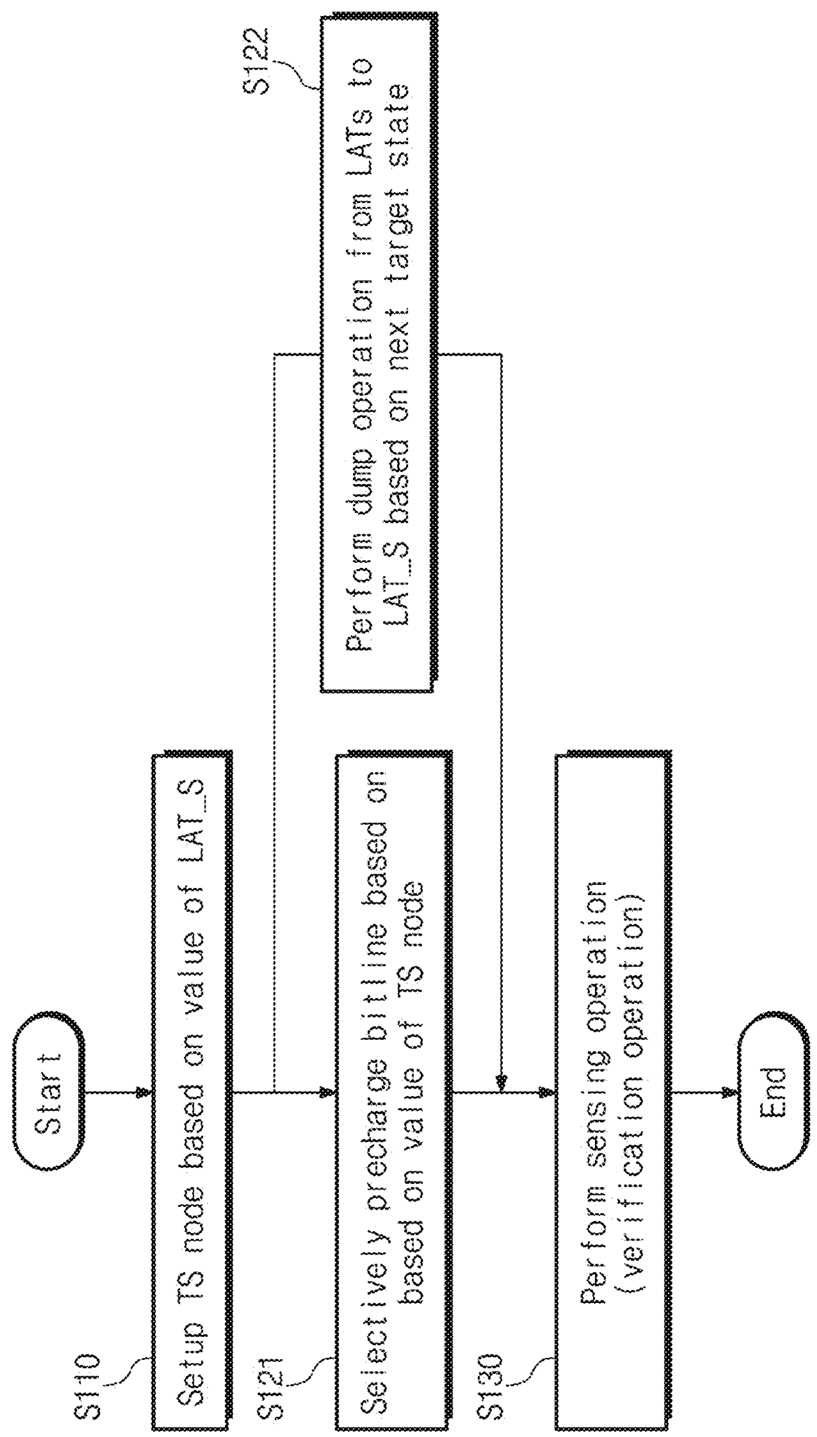
FIG. 7 is a flowchart illustrating a verify step of a memory device described with reference to FIG. 4.

FIG. 7 is a flowchart illustrating a verify step of a memory device described with reference to FIG. 4. In some example embodiments, a verify step according to the flowchart of FIG. 7 shows one program state verification belonging to a verify step included in one of a plurality of program loops. Referring to FIGS. 1, 6, and 7, the memory device 100 may perform the program state verification by performing operation S110 to operation S130. In some example embodiments, after performing a program step (e.g., a step of applying a program voltage to a selected word line), the memory device 100 may perform the program state verification according to the flowchart of FIG. 7.

In operation S110, the memory device 100 may set up the temporary storage node n_TS based on a value of the sensing latch LAT_S. For example, the sensing latch LAT_S may store information or target state information corresponding to a program state (e.g., a target program state) to be verified in a current verify step. The target state information may be stored in the sensing latch LAT_S through a dump operation from the first to third latches LAT_1 to LAT_3 to the sensing latch LAT_S.

In operation S121, the memory device 100 may selectively precharge a corresponding bit line based on a value of the temporary storage node n_TS (e.g., the target state information). For example, a program state may be assumed to be verified in a current program state verification and may be the seventh program state P7. In the case where data stored in the first to third latches LAT_1 to LAT_3 of the first page buffer PB1 correspond to the seventh program state P7, a value (e.g., target state information) stored at the temporary storage node n_TS may have a first level (e.g., a low level). The first page buffer PB1 may precharge the first bit line BL1 based on the first level of the temporary storage node n_TS. In contrast, in the case where the data stored in the first to third latches LAT_1 to LAT_3 of the first page buffer PB1 do not correspond to the seventh program state P7, the value (e.g., target state information) stored at the temporary storage node n_TS may have a second level (e.g., a high level). The first page buffer PB1 may not precharge the first bit line BL1 based on the second level of the temporary storage node n_TS.

In operation S122, the memory device 100 may perform the dump operation from the first to third latches LAT_1 to LAT_3 to the sensing latch LAT_S based on a next target program state to be verified in a next program state verification. For example, a program state may be assumed to be verified in a next program state verification which may be the sixth program state P6. In the case where data stored in the first to third latches LAT_1 to LAT_3 correspond to the sixth program state P6, the dump operation is performed such that the sensing latch LAT_S stores the first level (e.g., the low level). In contrast, in the case where the data stored in the first to third latches LAT_1 to LAT_3 do not correspond to the sixth program state P6, the dump operation is performed such that the sensing latch LAT_S stores the second level (e.g., the high level). After the dump operation in operation S122 is completed, the sensing latch LAT_S may store information (e.g., next target state information) about a program state to be verified in a next program state verification.

In some example embodiments, operation S121 and operation S122 may be performed wholly or at least partially at the same time or in parallel. For example, as described with reference to FIG. 6, in a current program state verification, because bit line precharging is performed based on a value of the temporary storage node n_TS, the sensing latch LAT_S does not need to maintain target state information. Accordingly, while bit line precharging is performed, even though next target state information is dumped to the sensing latch LAT_S, the memory device 100 may normally perform bit line precharging or a program state verification.

In operation S130, the memory device 100 may perform a sensing operation (e.g., a verification operation). For example, the memory device 100 may apply a verification voltage to a selected word line after operation S121 (e.g., a bit line precharge operation) and operation S122 (e.g., a dump operation for next target state information) are completed. The memory device 100 may sense or verify a program state of a target memory cell based on a voltage change of the precharged bit line.

In some example embodiments, the memory device 100 may repeatedly perform the program state verification according to the flowchart of FIG. 7.

Figure 8:
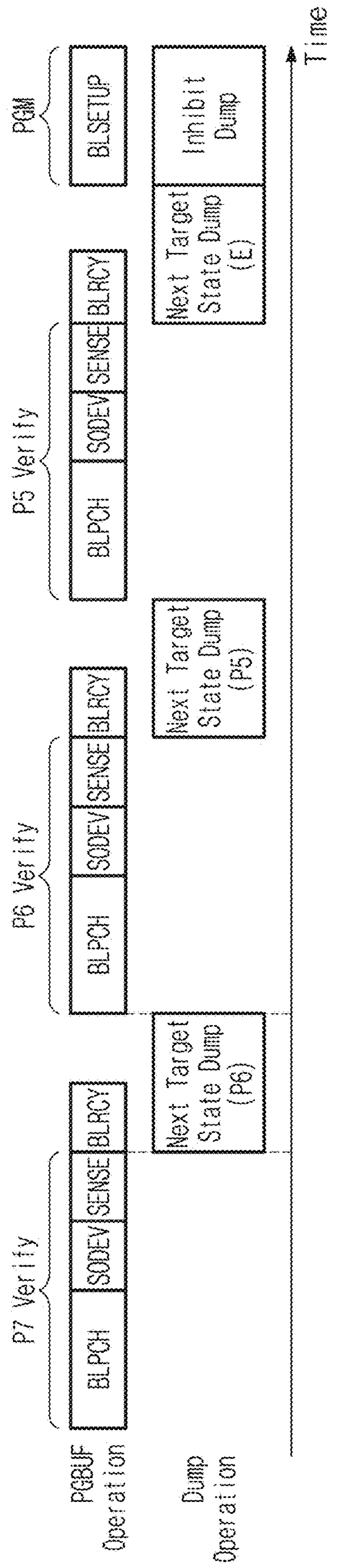
FIG. 8 is a timing diagram for describing a verify step of a memory device.
Figure 9:
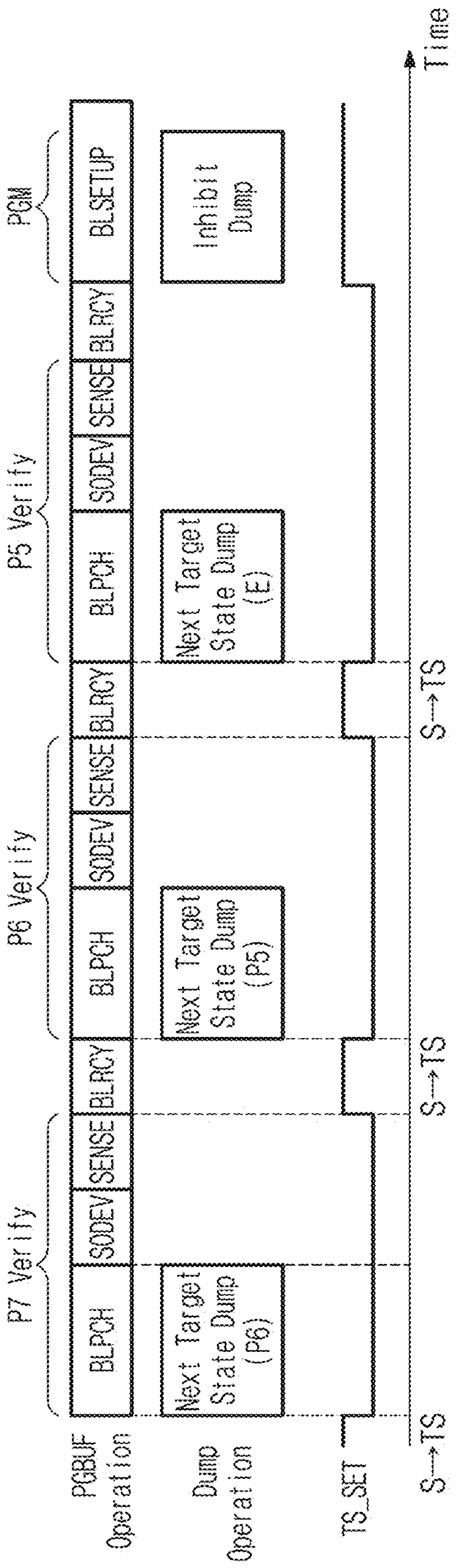
FIG. 9 is a timing diagram for describing a verify step according to the flowchart of FIG. 7 in detail.

FIG. 8 is a timing diagram for describing a verify step of a memory device. FIG. 9 is a timing diagram for describing a verify step according to the flowchart of FIG. 7 in detail. For brevity of drawing and convenience of description, it is assumed that the memory device 100 performs one verify step and in the verify step, the seventh, sixth, and fifth program state verifications for respectively verifying the seventh, sixth, and fifth program states P7, P6, and P5 may be sequentially performed. However, example embodiments are not limited thereto.

Referring to FIG. 8, the memory device 100 may perform the seventh program state verification P7 Verify. During the seventh program state verification P7 Verify, the memory device 100 may selectively precharge target bit lines (e.g., bit lines connected with memory cells corresponding to the seventh program state P7) (BLPCH). Afterwards, to verify program states of the memory cells corresponding to the seventh program state P7, the memory device 100 may perform a sensing node develop operation SODEV and a sensing operation SENSE. Afterwards, the target bit lines may be recovered (BLRCY).

Afterwards, the sixth program state verification P6 Verify and the fifth program state verification P5 Verify may be sequentially performed. The sixth program state verification P6 Verify and the fifth program state verification P5 Verify are similar to the seventh program state verification P7 Verify in that target state information are different, and thus, additional description will be omitted to avoid redundancy.

After the fifth program state verification P5 Verify is completed, the memory device 100 may perform an operation corresponding to the program step. In the program step, inhibit dump may be performed on memory cells to be program inhibited, and the bit line setup BLSETUP may be performed depending on a result of the inhibit dump.

In some example embodiments, in the bit line precharge period of the seventh program state verification P7 Verify, because target state information of the sensing latch LAT_S has to or is to be maintained, information about a next target state P6 may be dumped during the bit line recovery period BLRCY after the seventh program state verification P7 Verify is completed. In this case, the dump operation associated with the next target state may increase in a time necessary to or used to perform the verify step of the memory device 100, for example, to perform the program operation of the memory device 100.

Referring to FIG. 9, the memory device 100 may sequentially perform the seventh program state verification P7 Verify, the sixth program state verification P6 Verify, and the fifth program state verification P5 Verify. The bit line precharge operation BLPCH, the sensing node develop operation SODEV, the sensing operation SENSE, and the bit line recovery operation BLRCY that are performed in each of the seventh program state verification P7 Verify, the sixth program state verification P6 Verify, and the fifth program state verification P5 Verify are similar to those described with reference to FIG. 8, and thus, additional description will be omitted to avoid redundancy.

In some example embodiments, unlike the embodiment of FIG. 8, in the embodiment of FIG. 9, the memory device 100 may perform a dump operation for a next target program state during a bit line precharge operation of a current program state verification. For example, during the bit line precharge operation BLPCH of the seventh program state verification P7 Verify, target state information corresponding to the sixth program state P6 may be dumped to the sensing latch LAT_S. In this case, before the seventh program state verification P7 Verify is completed, the next target state information stored in the sensing latch LAT_S may include information about the sixth program state P6.

After the seventh program state verification P7 Verify is completed, the bit line recovery operation BLRCY may be performed. During the bit line recovery operation BLRCY, the temporary storage node setup signal TS_SET may be activated, and thus, the next target state information stored in the sensing latch LAT_S may be transferred to (or stored at) the temporary storage node n_TS.

Afterwards, the memory device 100 may perform the bit line precharge operation BLPCH of the sixth program state verification P6 Verify. In this case, the memory device 100 may selectively precharge a bit line corresponding to the sixth program state P6 based on the target state information stored at the temporary storage node n_TS.

While the memory device 100 performs the bit line precharge operation BLPCH of the sixth program state verification P6 Verify, the memory device 100 may perform the dump operation associated with next target state information (e.g., information about the fifth program state P5). The following operations are similar to the above-described operations, and thus, additional description will be omitted to avoid redundancy.

As described above, according to example embodiments, in a verify step, the memory device 100 may selectively precharge a bit line depending on a program state of a memory cell. In this case, target state information in a current program state verification may be stored at the temporary storage node n_TS, and next target state information may be dumped to the sensing latch LAT_S during a bit line precharge operation of the current program state verification. Accordingly, because the dump operation for target state information overlaps the bit line precharge operation, a time necessary for the verify step may be shortened.

FIGS. 10A to 10D are diagrams for describing operations according to the flowchart of FIG. 7. For brevity of drawing and convenience of description, the first to third page buffers PB1, PB2, and PB3 included in the page buffer circuit 140 are schematically illustrated. For brevity of drawing, detailed control signals that are provided to the first to third page buffers PB1, PB2, and PB3 are omitted.

Referring to FIGS. 10A to 10D, the page buffer circuit 140 may include the first to third page buffers PB1, PB2, and PB3. The first to third page buffers PB1, PB2, and PB3 may include latches LAT11 to LAT13, LAT21 to LAT23, and LAT31 to LAT33, sensing latches LAT_S1, LAT_S2, and LAT_S3, switches SW1, SW2, and SW3, temporary storage nodes TS1, TS2, and TS3, and precharge circuits PRE1, PRE2, and PRE3.

For example, in the first page buffer PB1, the latches LAT11, LAT12, and LAT13 may be similar to the latches LAT_1, LAT_2, and LAT_3 of FIG. 6, the sensing latch LAT_S1 may be similar to the sensing latch LAT_S of FIG. 6, the switch SW1 may be similar to the switch SW1 of FIG. 6, and the sensing node TS1 may be similar to the sensing node n_SO of FIG. 6. The precharge circuit PRE1 of the first page buffer PB1 may be similar to the remaining components of FIG. 6. The second and third page buffers PB2 and PB3 are similar to the first page buffer PB1, and thus, additional description will be omitted to avoid redundancy.

The first page buffer PB1 may be connected with the first bit line BL1, and the latches LAT11 to LAT13 of the first page buffer PB1 may store a value (e.g., "LLL") corresponding to the seventh program state P7. The second page buffer PB2 may be connected with the second bit line BL2, and the latches LAT21 to LAT23 of the second page buffer PB2 may store a value (e.g., "LLH") corresponding to the sixth program state P6. The third page buffer PB3 may be connected with the third bit line BL3, and the latches LAT31 to LAT33 of the third page buffer PB3 may store a value (e.g., "LHH") corresponding to the fifth program state P5. In some example embodiments, a value corresponding to each program state is only one example and may be variously changed or modified depending on the bit ordering of the memory device 100.

Figure 10A:
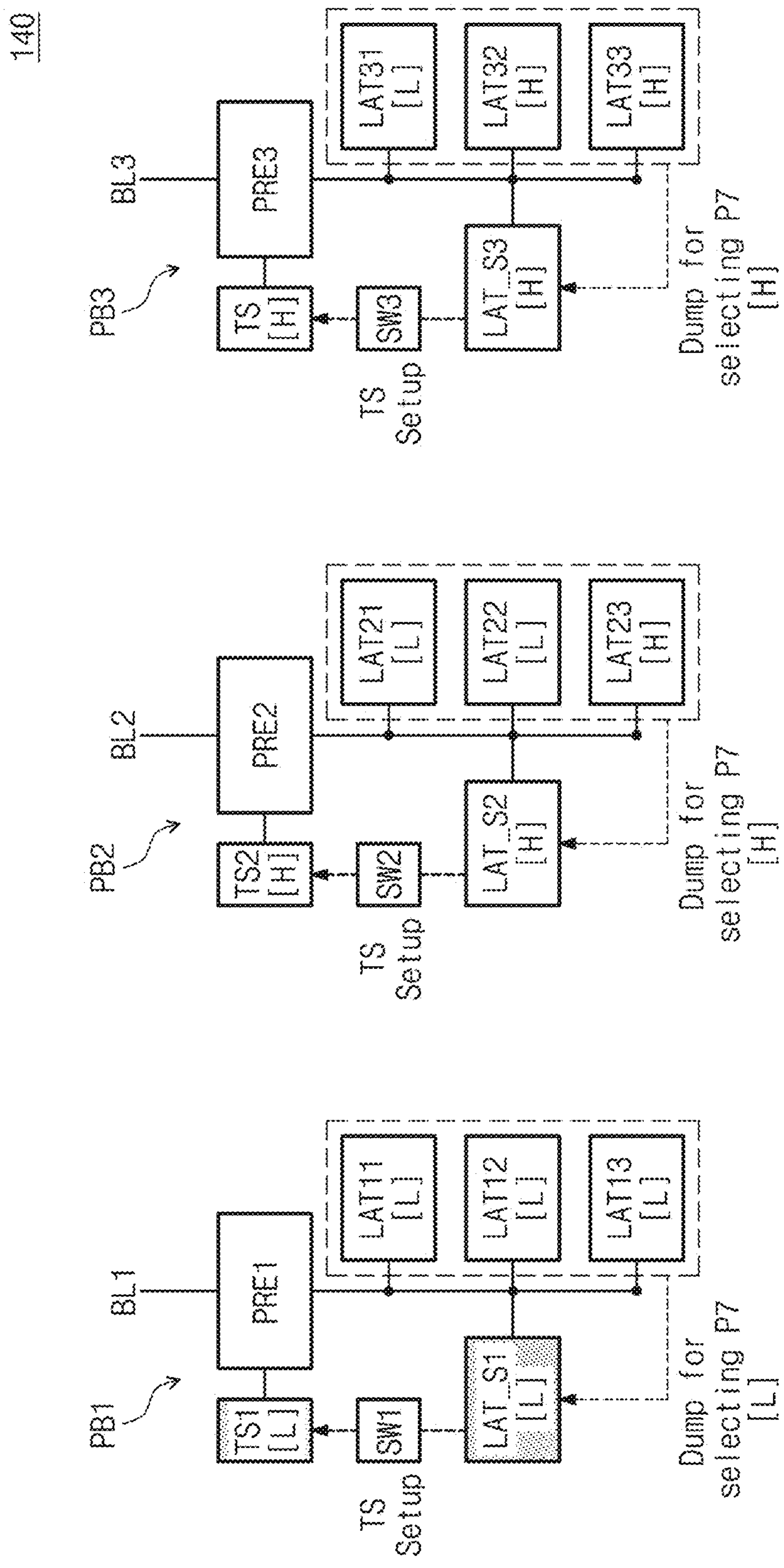
FIGS. 10A to 10D are diagrams for describing operations according to the flowchart of FIG. 7.

As illustrated in FIG. 10A, to perform the seventh program state verification, the memory device 100 may perform a dump operation associated with target state information corresponding to the seventh program state P7 (e.g., a dump operation for selecting the seventh program state P7). In this case, a low value "L" may be dumped to the first sensing latch LAT_S1 based on the values of the latches LAT11 to LAT13 of the first page buffer PB1; a high value "H" may be dumped to the second sensing latch LAT_S2 based on the values of the latches LAT21 to LAT23 of the second page buffer PB2; a high value "H" may be dumped to the third sensing latch LAT_S3 based on the values of the latches LAT31 to LAT33 of the third page buffer PB3.

The values of the first to third sensing latches LAT_S1, LAT_S2, and LAT_S3 of the first to third page buffers PB1, PB2, and PB3 may be transferred to the first to third temporary storage nodes TS1, TS2, and TS3 through the first to third switches SW1, SW2, and SW3. In this case, the first to third temporary storage nodes TS1, TS2, and TS3 may be set up with a low level "L", a high level "H", and a low level "L", respectively.

Figure 10B:
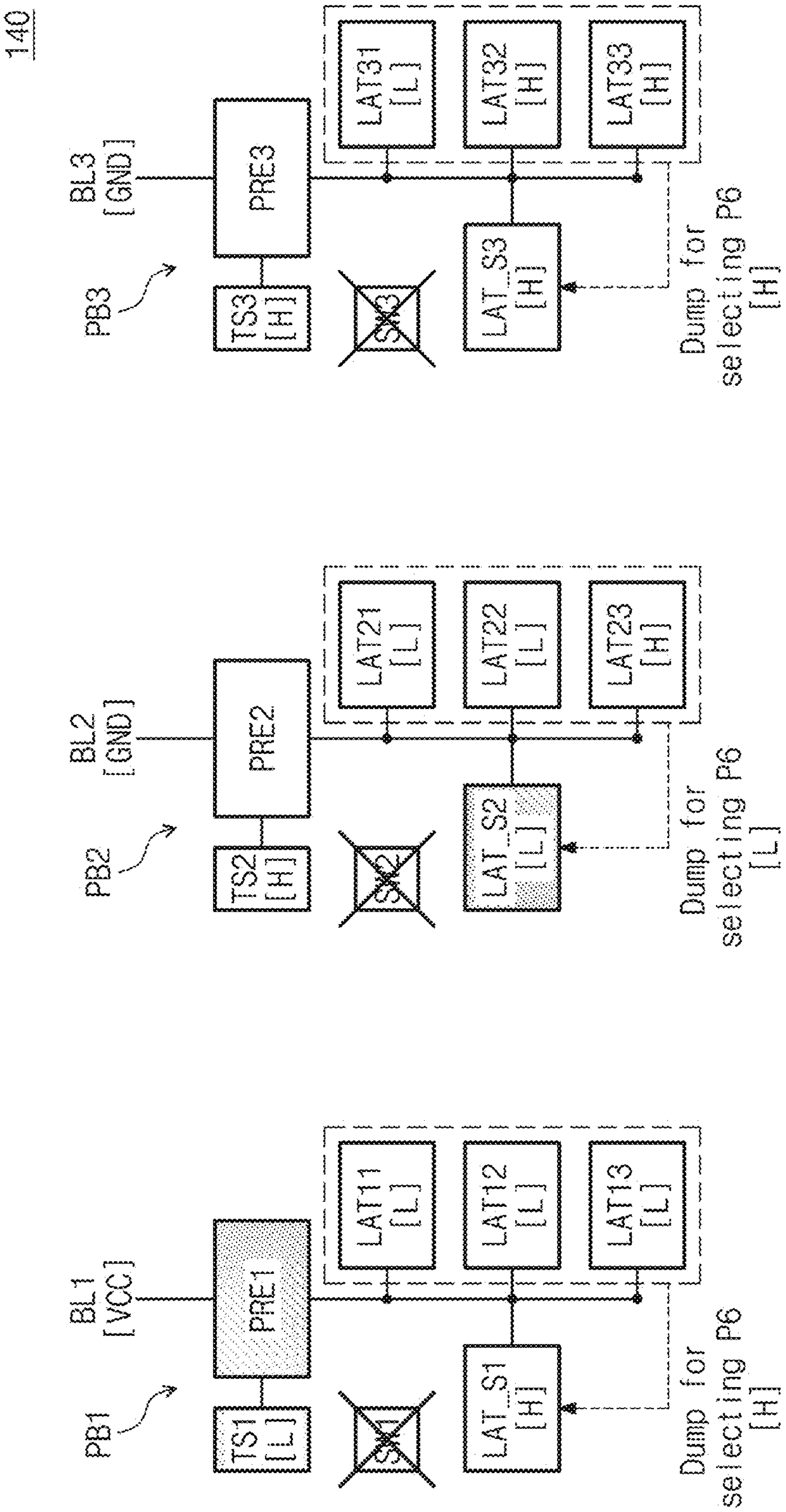

Afterwards, as illustrated in FIG. 10B, the first to third precharge circuits PRE1, PRE2, and PRE3 of the first to third page buffers PB1, PB2, and PB3 may selectively precharge the first to third bit lines BL1, BL2, and BL3 based on the values of the first to third temporary storage nodes TS1, TS2, and TS3. For example, the first precharge circuit PRE1 may precharge the first bit line BL1 with the power supply voltage VCC in response to the value (e.g., the low level) of the first temporary storage node TS1. In response to the value (e.g., the high level) of the second temporary storage node TS2, the second precharge circuit PRE2 may not precharge the second bit line BL2 or may maintain the second bit line BL2 at a ground voltage GND. In response to the value (e.g., the high level) of the third temporary storage node TS3, the third precharge circuit PRE3 may not precharge the third bit line BL3 or may maintain the third bit line BL3 at the ground voltage GND.

While the first to third precharge circuits PRE1, PRE2, and PRE3 selectively precharge the first to third bit lines BL1, BL2, and BL3 based on the values of the first to third temporary storage nodes TS1, TS2, and TS3, a dump operation for a next program state verification (e.g., a dump operation for selecting the sixth program state P6) may be performed. For example, while the bit line pre-charge operation is performed, the first page buffer PB1 may dump a value of the high level "H" to the first sensing latch LAT_S1 based on the value (e.g., "LLL") of the latches LAT11 to LAT13, the second page buffer PB2 may dump a value of the low level "L" to the second sensing latch LAT_S2 based on the value (e.g., "LLH") of the latches LAT21 to LAT23, and the third page buffer PB3 may dump a value of the high level "H" to the third sensing latch LAT_S3 based on the value (e.g., "LHH") of the latches LAT31 to LAT33. That is, while the bit line precharge operation is performed, next target state information may be dumped to a sensing latch.

In some example embodiments, while the bit line precharge operation is performed, the first to third switches SW1, SW2, and SW3 may maintain a turn-off state.

Figure 10C:
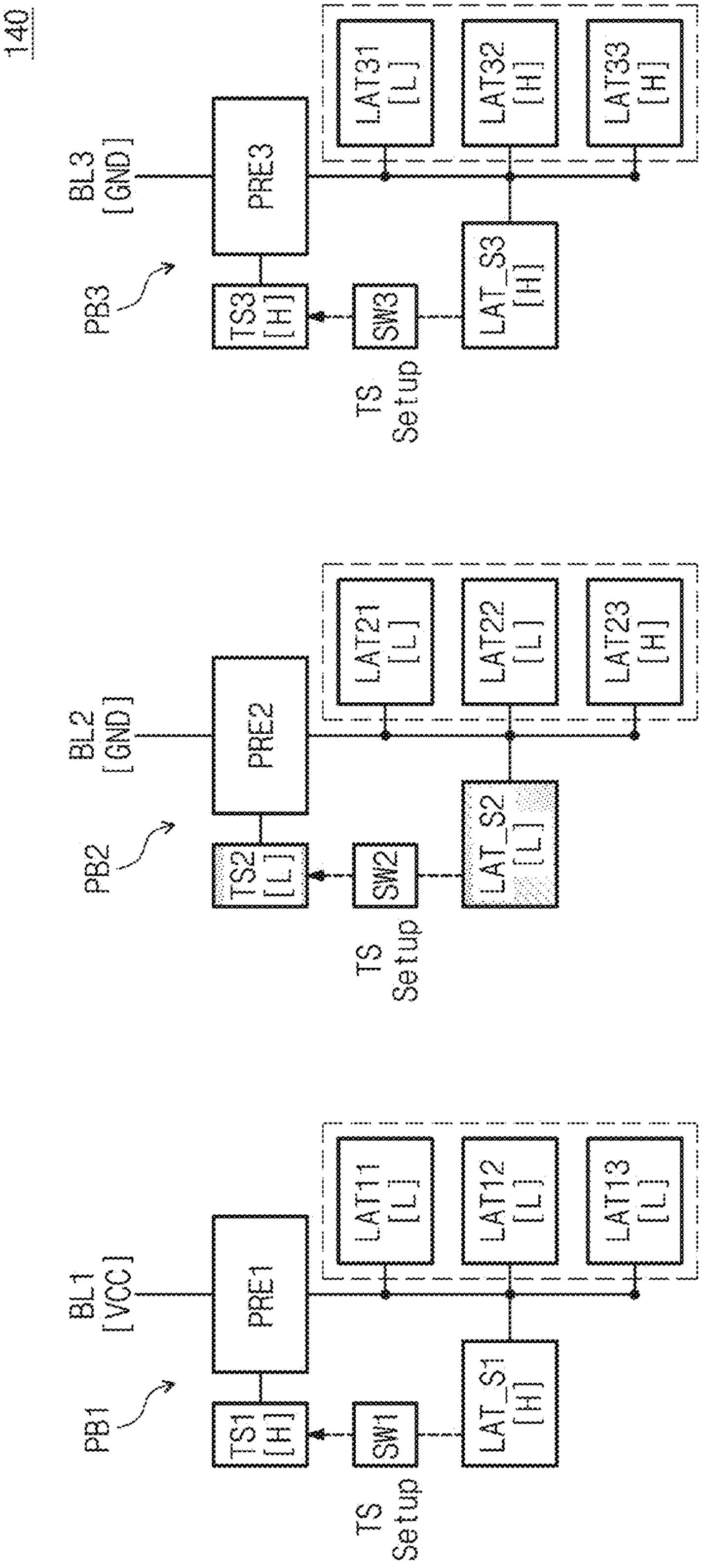

Afterwards, as illustrated in FIG. 10C, as the first to third switches SW1, SW2, and SW3 are turned on, target state information may be transferred from the first to third sensing latches LAT_S1, LAT_S2, and LAT_S3 to the first to third temporary storage nodes TS1, TS2, and TS3. In this case, the first to third temporary storage nodes TS1, TS2, and TS3 may be set up with the high level "H", the low level "L", and the high level "H", respectively.

Figure 10D:
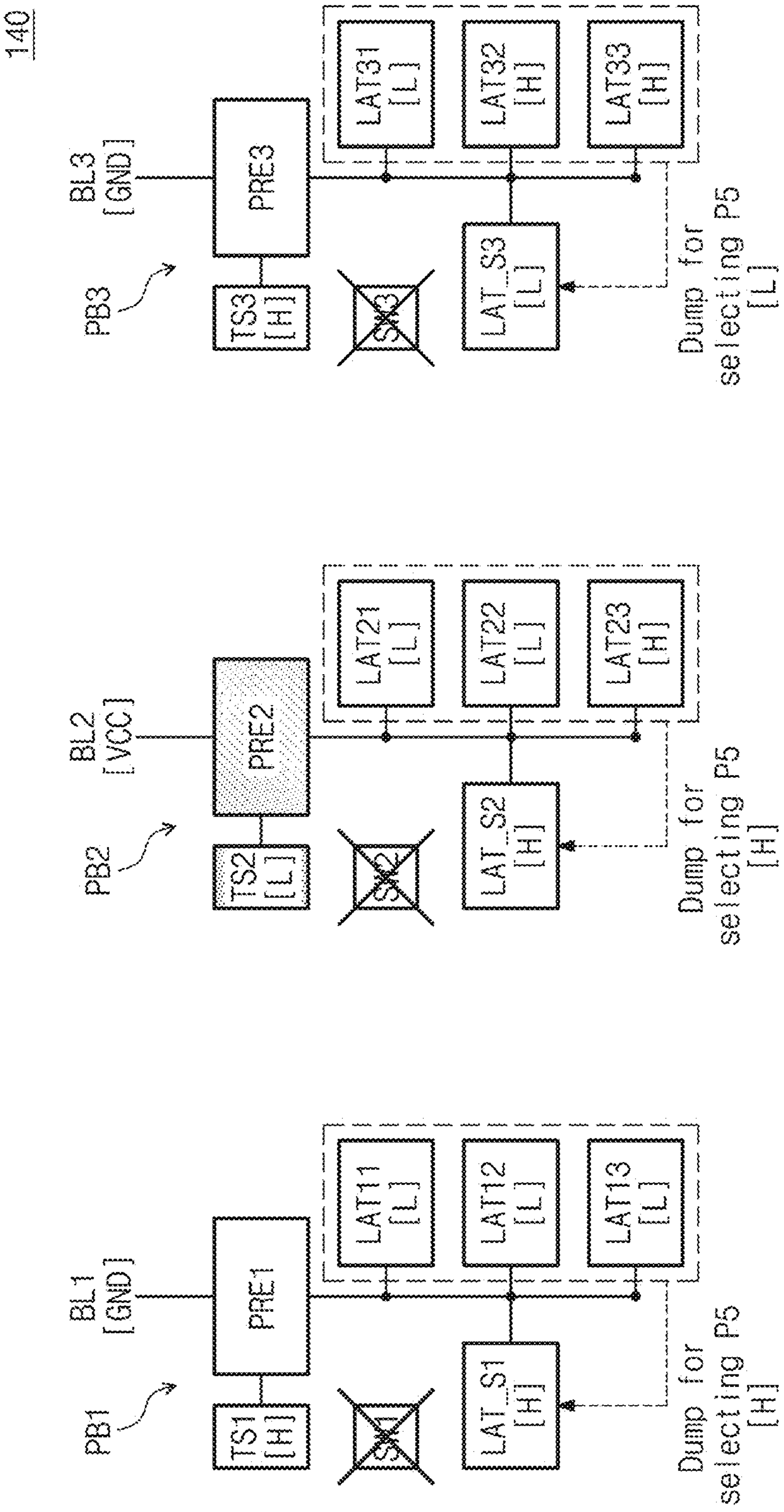

Afterwards, as illustrated in FIG. 10D, the first to third precharge circuits PRE1, PRE2, and PRE3 may selectively precharge the first to third bit lines BL1, BL2, and BL3 based on the values of the first to third temporary storage nodes TS1, TS2, and TS3. For example, in response to the value (e.g., the high level) of the first temporary storage node TS1, the first precharge circuit PRE1 may not precharge the first bit line BL1 or may maintain the first bit line BL1 at the ground voltage GND. The second precharge circuit PRE2 may precharge the second bit line BL2 with the power supply voltage VCC in response to the value (e.g., the low level) of the second temporary storage node TS2. In response to the value (e.g., the high level) of the third temporary storage node TS3, the third precharge circuit PRE3 may not precharge the third bit line BL3 or may maintain the third bit line BL3 at the ground voltage GND.

While the first to third precharge circuits PRE1, PRE2, and PRE3 selectively precharge the first to third bit lines BL1, BL2, and BL3 based on the values of the first to third temporary storage nodes TS1, TS2, and TS3, a dump operation for a next program state verification (e.g., a dump operation for selecting the fifth program state P5) may be performed. The dump operation for selecting the fifth program state P5 is similar to that described with reference to FIG. 10B except that target program states are different, and thus, additional description will be omitted to avoid redundancy.

As described above, according to example embodiments, a dump operation for selecting a next target program state (or a dump operation for setting next target state information to the sensing latch LAT_S) may be performed during a current bit line precharge period. In this case, because a time necessary for a dump operation decreases, a total program time may be shortened.

Figure 11:
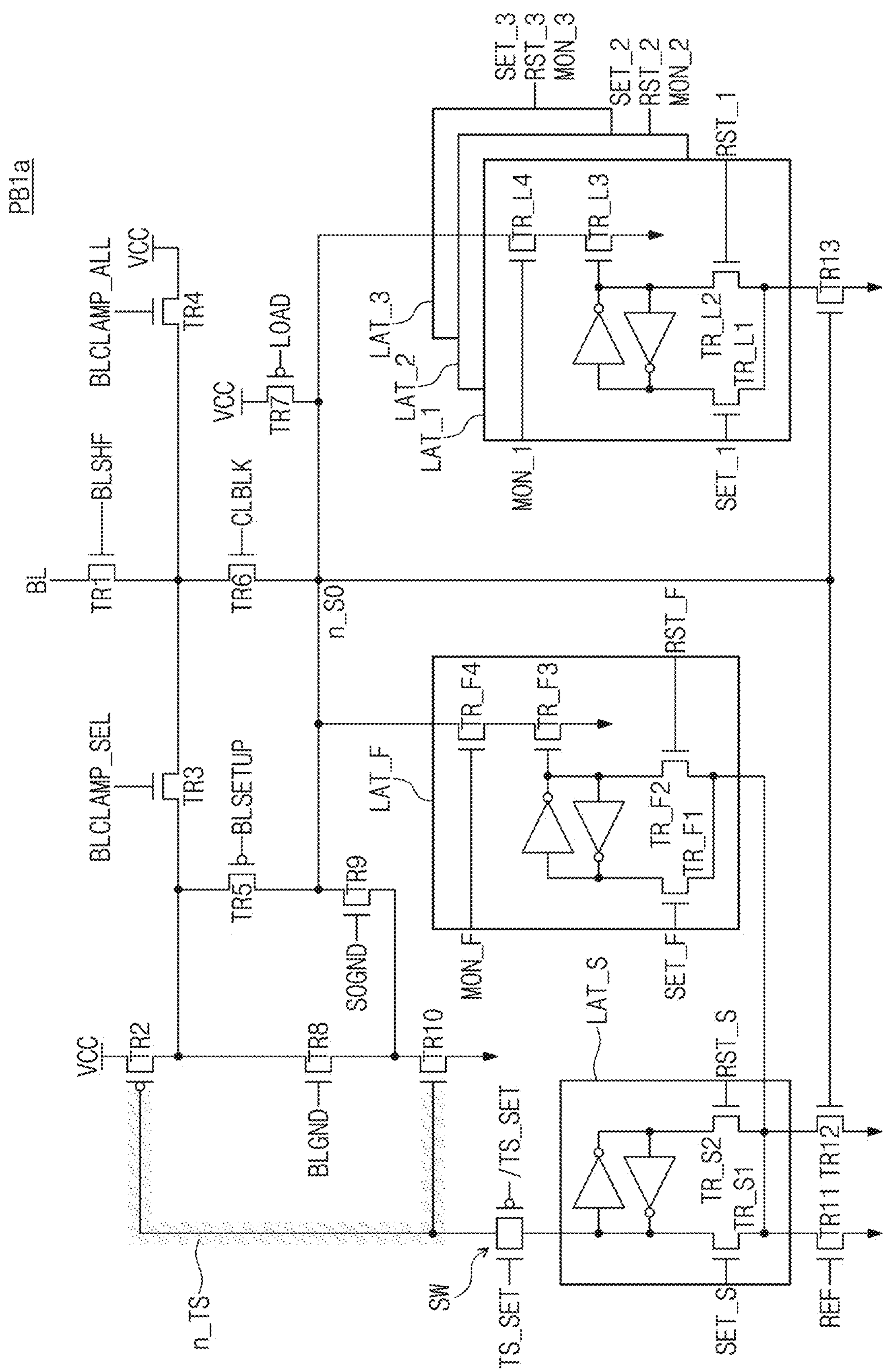
FIG. 11 is a circuit diagram illustrating a first page buffer of FIG. 5.

FIG. 11 is a circuit diagram illustrating a first page buffer of FIG. 5. In some example embodiments, a first page buffer PB1*a* of FIG. 11 may be similar to the first page buffer PB1 of FIG. 6 except for some components. For convenience of description, additional description associated with the components described with reference to the first page buffer PB1 of FIG. 6 will be omitted to avoid redundancy.

Referring to FIG. 11, the first page buffer PB1*a* may include the plurality of transistors TR1 to TR13, the switch SW, the sensing latch LAT_S, and the first to third latches LAT_1 to LAT_3. The plurality of transistors TR1 to TR13, the switch SW, the sensing latch LAT_S, and the first to third latches LAT_1 to LAT_3 are similar to those described with reference to FIG. 6, and thus, additional description will be omitted to avoid redundancy.

The first page buffer PB1*a* may further include an F-latch LAT_F. The F-latch LAT_F may be connected between the sensing node n_SO and the connection node of the eleventh and twelfth transistors TR11 and TR12. The F-latch LAT_F may include two inverters and first to fourth F-latch transistors TR_F1, TR_F2, TR_F3, and TR_F4.

The two inverters may have a cyclic (or latch) structure in which an input and an output of one inverter are respectively connected with an output and an input of the other inverter. The first F-latch transistor TR_F1 may be connected between a first node between the two inverters and the connection node of the eleventh and twelfth transistors TR11 and TR12 and may operate in response to an F-latch set signal SET_F. The second F-latch transistor TR_F2 may be connected between a second node between the two inverters and the connection node of the eleventh and twelfth transistors TR11 and TR12 and may operate in response to an F-latch reset signal SET_F. The third and fourth F-latch transistors TR_F3 and TR_F4 may be connected in series between the sensing node n_SO and the ground voltage, the third F-latch transistor TR_F3 may operate in response to a level of the second node between the two inverters, and the fourth F-latch transistor TR_F4 may operate in response to an F-latch control signal MON_F. The F-latch LAT_F may be configured to store data in response to the control signals SET_F, RST_F, and MON_F or to output the stored data in response to the control signals SET_F, RST_F, and MON_F.

In some example embodiments, the F-latch LAT_F may be used for 2-step verification of the memory device 100. For example, program speeds (e.g., variations in threshold voltages) of memory cells may be different depending on various characteristics of the memory cells. To compensate for a difference between program speeds of memory cells, the memory device 100 may perform verification on one program state two times and may control a voltage of a corresponding bit line in a next program step depending on a result of the two verifications.

Figure 12:
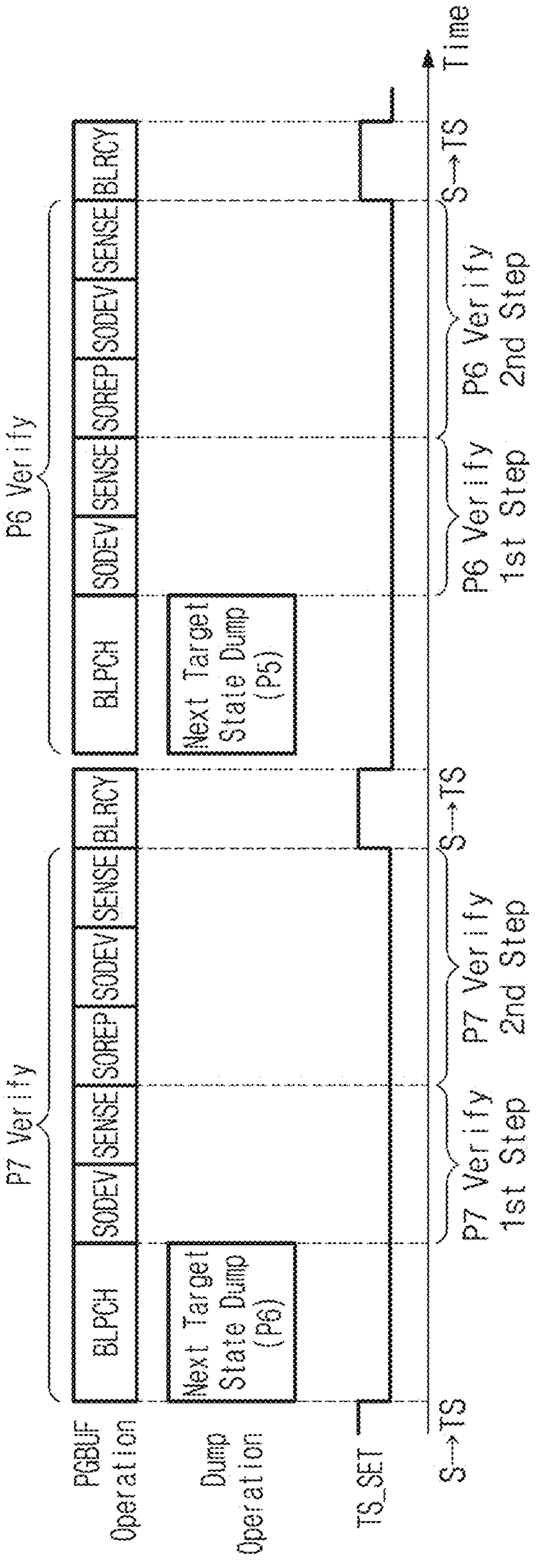
FIG. 12 is a timing diagram for describing 2-step verification using a page buffer of FIG. 11.

FIG. 12 is a timing diagram for describing 2-step verification using a page buffer of FIG. 11. Referring to FIGS. 11 and 12, the memory device 100 may perform the seventh and sixth program state verifications P7 Verify and P6 Verify. During the seventh program state verification P7 Verify, the memory device 100 may selectively precharge target bit lines (e.g., bit lines connected with memory cells corresponding to the seventh program state P7) (BLPCH). Afterwards, the memory device 100 may perform the sensing node develop operation SODEV and the sensing operation SENSE to perform a first step of the seventh program state verification P7 Verify. Afterwards, the memory device 100 may perform a sensing node re-precharge operation SOREP, the sensing node develop operation SODEV, and the sensing operation SENSE to perform a second step of the seventh program state verification P7 Verify.

In some example embodiments, the memory device 100 may perform a dump operation for a next target program state during a bit line precharge operation of a current program state verification, and may perform a dump operation from the sensing latch LAT_S to the temporary storage node n_TS (S→TS) (or a temporary storage node setup operation) during the bit line recovery operation BLRCY. This is similar to the operation described with reference to FIG. 9, and thus, additional description will be omitted to avoid redundancy.

As described above, the memory device 100 may sense a program speed difference of memory cells by performing two verify operations in the seventh program state verification P7 Verify and may selectively control a level of bit lines based on the sensed result in the following programming.

Also, because the memory device 100 dumps next target state information to a sensing latch during a bit line precharge operation of a current program state verification, a total time necessary for the verify step may be shortened.

Figure 13:
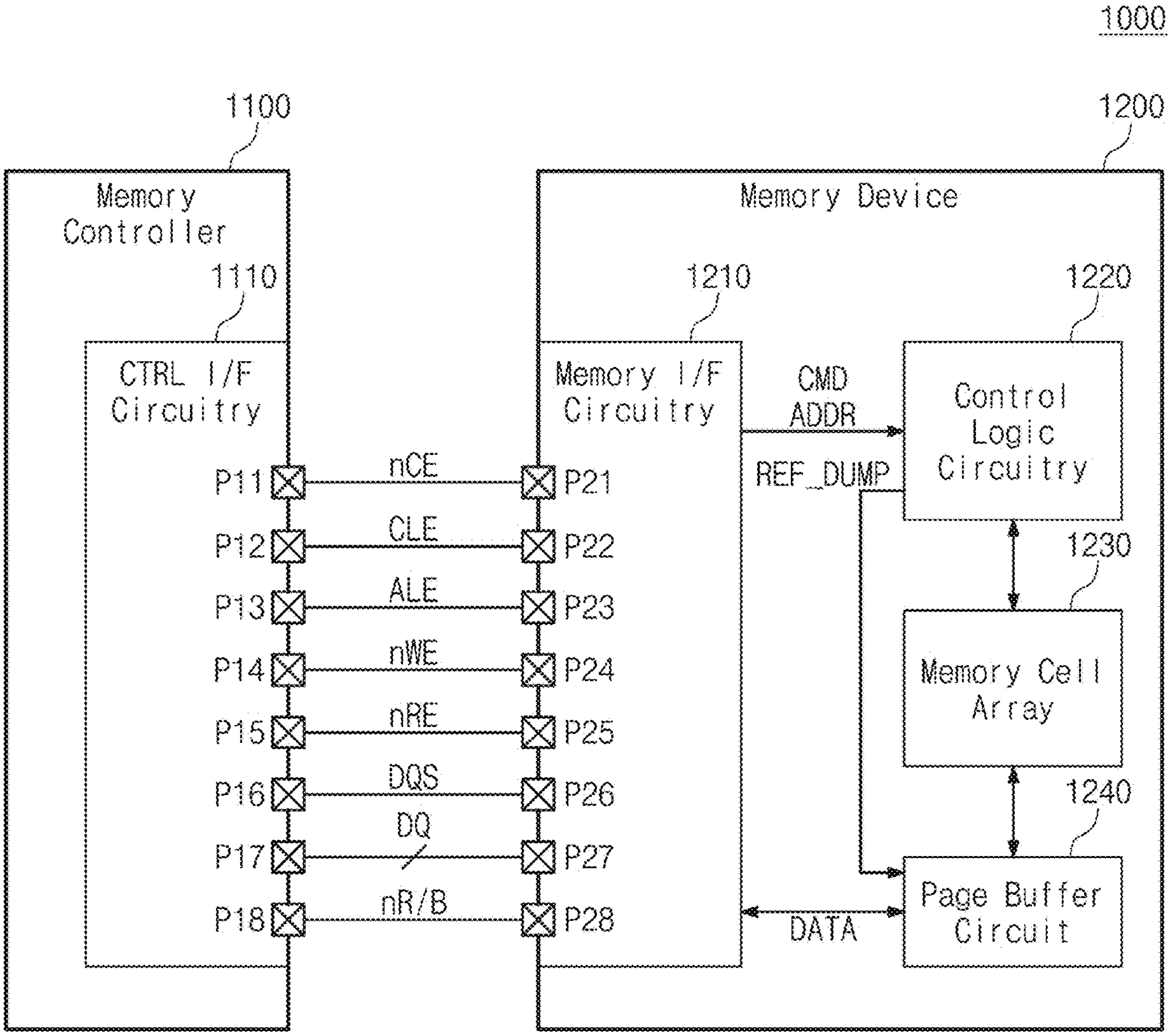
FIG. 13 is a block diagram illustrating a memory system according to some example embodiments.

FIG. 13 is a block diagram illustrating a memory system according to some example embodiments. Referring to FIG. 13, a memory system 1000 may include a memory controller 1100 and a memory device 1200. In some example embodiments, a communication channel between the memory controller 1100 and the memory device 1200 will be described with reference to FIG. 13, but example embodiments are not limited thereto. The memory controller 1100 and any other memory devices may communicate with each other through any other channels (e.g., a plurality of channels) similar to the channel described with reference to FIG. 13.

The memory controller 1100 may include a controller interface circuitry 1110. The controller interface circuitry 1210 may include first to eighth pins P11 to P18. The memory controller 1100 may transmit various signals to the memory device 1200 through the plurality of pins P11 to P18 of the controller interface circuitry 1210. For example, the memory controller 1100 may transmit a chip enable signal nCE to the memory device 1200 through the first pin P11, may transmit a command latch enable signal CLE to the memory device 1200 through the second pin P12, may transmit an address latch enable signal ALE to the memory device 1200 through the third pin P13, may transmit a write enable signal nWE to the memory device 1200 through the fourth pin P14, may transmit a read enable signals nRE to the memory device 1200 through the fifth pin P15, may exchange a data strobe signal DQS with the memory device 1200 through the sixth pin P16, may exchange a data signal DQ with the memory device 1200 through the seventh pin P17, and may receive a ready signal (or a busy signal) nR/B from the memory device 1200 through the eighth pin P18. In some example embodiments, the seventh pin P17 may include a plurality of pins depending on the way to implement.

The memory device 1200 may include a memory interface circuitry 1210, a control logic circuitry 1220, a memory cell array 1230, and a page buffer circuit 1240. The memory interface circuitry 1210 may include first to eighth pins P21 to P28. The memory interface circuitry 1210 may receive various signals from the memory controller 1100 through the first to eighth pins P21 to P28. Various signals between the memory controller 1100 and the memory device 1200 are described above, and thus, additional description will be omitted to avoid redundancy.

The memory interface circuitry 1210 may obtain the command CMD from the data signal DQ received in an enable period (e.g., at a high-level state) of the command latch enable signal CLE, based on toggle timings of the write enable signal nWE. The memory interface circuitry 1210 may obtain the address ADDR from the data signal DQ received in an enable period (e.g., at a high-level state) of the address latch enable signal ALE, based on toggle timings of the write enable signal nWE.

In some example embodiments, the write enable signal nWE may maintain a static state (e.g., a high level or a low level) and may then toggle between the high level and the low level. For example, the write enable signal nWE may toggle in a period where the command CMD or the address ADDR is transmitted. In this case, the memory interface circuitry 1210 may obtain the command CMD or the address ADDR based on toggle timings of the write enable signal nWE.

In a data output operation of the memory device 1200, the memory interface circuitry 1210 may receive the toggling read enable signal nRE through the fifth pin P25 before outputting the data "DATA". The memory interface circuitry 1210 may generate the toggling data strobe signal DQS based on toggling of the read enable signal nRE. For example, the memory interface circuitry 1210 may generate the data strobe signal DQS that starts to toggle after a given delay (e.g., tDQSRE) from a time at which the read enable signal nRE starts to toggle. The memory interface circuitry 1210 may transmit the data signal DQ including the data "DATA" in synchronization with toggle timings of the data strobe signal DQS. As such, the data "DATA" may be aligned with the toggle timings of the data strobe signal DQS and may be transmitted to the memory controller 1100.

In a data input operation of the memory device 1200, the memory interface circuitry 1210 may receive the toggling data strobe signal DQS together with the data signal DQ including the data "DATA" from the memory controller 1100. The memory interface circuitry 1210 may obtain the data "DATA" from the data signal DQ based on toggle timings of the data strobe signal DQS. For example, the memory interface circuitry 1210 may obtain the data "DATA" by sampling the data signal DQ at a rising edge and a falling edge of the data strobe signal DQS.

The memory interface circuitry 1210 may transmit a ready/busy output signal nR/B to the memory controller 1100 through the eighth pin P28. When the memory device 1200 is in a busy state (e.g., in the case where internal operations are being performed), the memory interface circuitry 1210 may transmit to the memory controller 1100, the ready/busy output signal nR/B indicating a busy state. When the memory device 1200 is in a ready state (e.g., in the case where internal operations are not performed or are completed), the memory interface circuitry 1210 may transmit, to the memory controller 1100, the ready/busy output signal nR/B indicating a ready state.

The control logic circuitry 1220 may control various kinds of operations of the memory device 1200. The control logic circuitry 1220 may receive a command/address CMD/ADDR obtained by the memory interface circuitry 1210. The control logic circuitry 1220 may generate control signals for controlling any other components of the memory device 1200 depending on the received command/address CMD/ADDR.

The memory cell array 1230 may store the data "DATA" obtained by the memory interface circuitry 1210 under control of the control logic circuitry 1220. Under control of the control logic circuitry 1220, the memory cell array 1230 may output the stored data "DATA" to the memory interface circuitry 1210.

The memory cell array 1230 may include a plurality of memory cells. For example, the plurality of memory cells may be flash memory cells. However, example embodiments are not limited thereto. For example, the memory cells may include one or more of resistive random access memory (RRAM) cells, ferroelectric random access memory (FRAM) cells, phase change random access memory (PRAM) cells, thyristor random access memory (TRAM) cells, or magnetic random access memory (MRAM) cells.

Under control of the control logic circuitry 1220, the page buffer circuit 1240 may temporarily store data to be stored in the memory cell array 1230 or may temporarily store data read from the memory cell array 1230. The page buffer circuit 1240 may exchange the data "DATA" with the memory interface circuitry 1210.

In some example embodiments, the memory controller 1100 may transmit a suspend command for suspending an operation of the memory device 1200. The memory device 1200 may suspend an operation being performed (e.g., a program operation) in response to the suspend command. In this case, a variety of information (e.g., information about data to be programmed) associated with the suspended operation (hereinafter referred to as "suspend information") may be temporarily stored in the page buffer circuit 1240. In some example embodiments, the page buffer circuit 1240 may include a dynamic latch configured to store suspend information. Due to various leakage currents, data stored in the dynamic latch may be lost over time. That is, to maintain data stored in the dynamic latch, a refresh operation for the dynamic latch may be required before a retention time of the dynamic latch.

Below, for convenience of description, some example embodiments in which the page buffer circuit 1240 further includes the dynamic latch is described, but example embodiments are not limited thereto. For example, one of a plurality of latches (e.g., LAT_1 to LAT_3) included in the page buffer circuit 1240 may be used as the dynamic latch. Alternatively, the dynamic latch may be implemented with one or more of a plurality of data latches included in the page buffer circuit 1240.

When the memory device 1200 suspends an operation, the control logic circuitry 1220 may periodically generate a refresh dump signal REF_DUMP, and the page buffer circuit 1240 may perform a refresh dump operation on the dynamic latch. In some example embodiments, the refresh dump operation may be performed through the temporary storage node n_TS described with reference to FIGS. 1 to 12. The refresh dump operation will be described in detail with reference to the following drawings.

Figure 14:
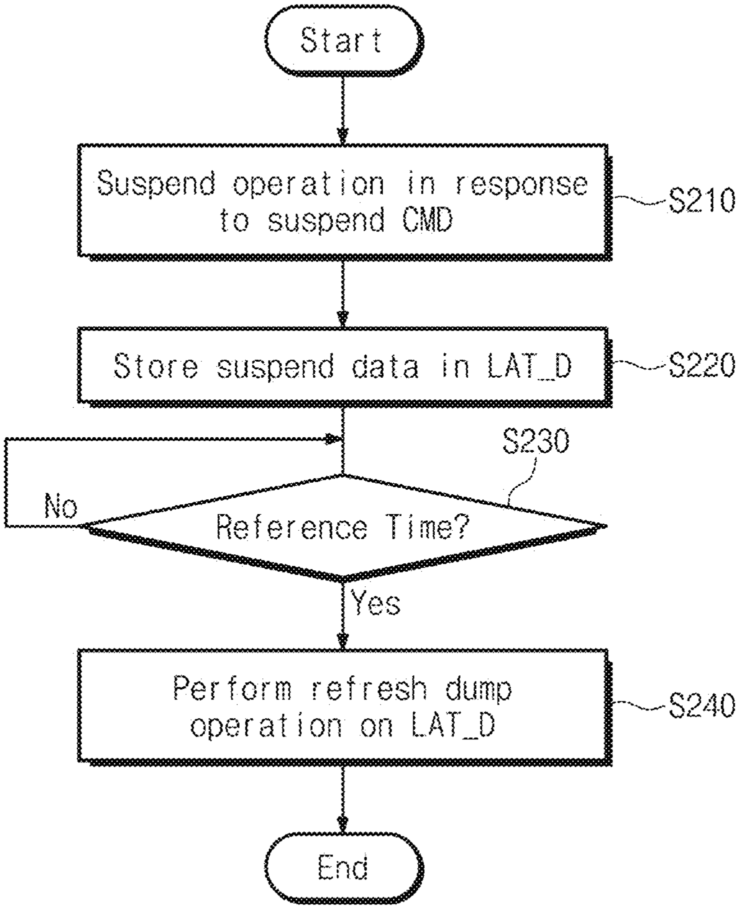
FIG. 14 is a flowchart illustrating an operation of a memory device of FIG. 13.

FIG. 14 is a flowchart illustrating an operation of a memory device of FIG. 13. Referring to FIGS. 13 and 14, in operation S210, the memory device 100 may suspend an operation being performed, in response to a suspend command from the memory controller 1100.

In operation S220, the memory device 1200 may store suspend information in a dynamic latch LAT_D (refer to FIG. 15) of the page buffer circuit 1240. A configuration of the dynamic latch LAT_D will be described in detail with reference to FIG. 15.

In operation S230, the memory device 1200 may determine whether a reference time passes. In some example embodiments, the memory device 100 may determine whether the reference time passes from a time at which the suspend command is received. Alternatively, the memory device 100 may determine whether the reference time passes from a time at which the suspend information is stored in the dynamic latch LAT_D. Alternatively, the memory device 100 may determine whether the reference time passes from a time at which an additional command (e.g., a cache read command) is received after the suspend command is received. That is, the memory device 100 may measure an elapsed time from various points in times and may compare the measured elapsed time and the reference time.

When the reference time passes, in operation S240, the memory device 100 may perform a refresh dump operation on the dynamic latch LAT_D. As the refresh dump operation is performed on the dynamic latch LAT_D, the data stored in the dynamic latch LAT_D may be maintained. In some example embodiments, the refresh dump operation associated with the dynamic latch LAT_D may be performed by using the temporary storage node n_TS of a page buffer. The refresh dump operation will be described in detail with reference to the following drawings.

Figure 15:
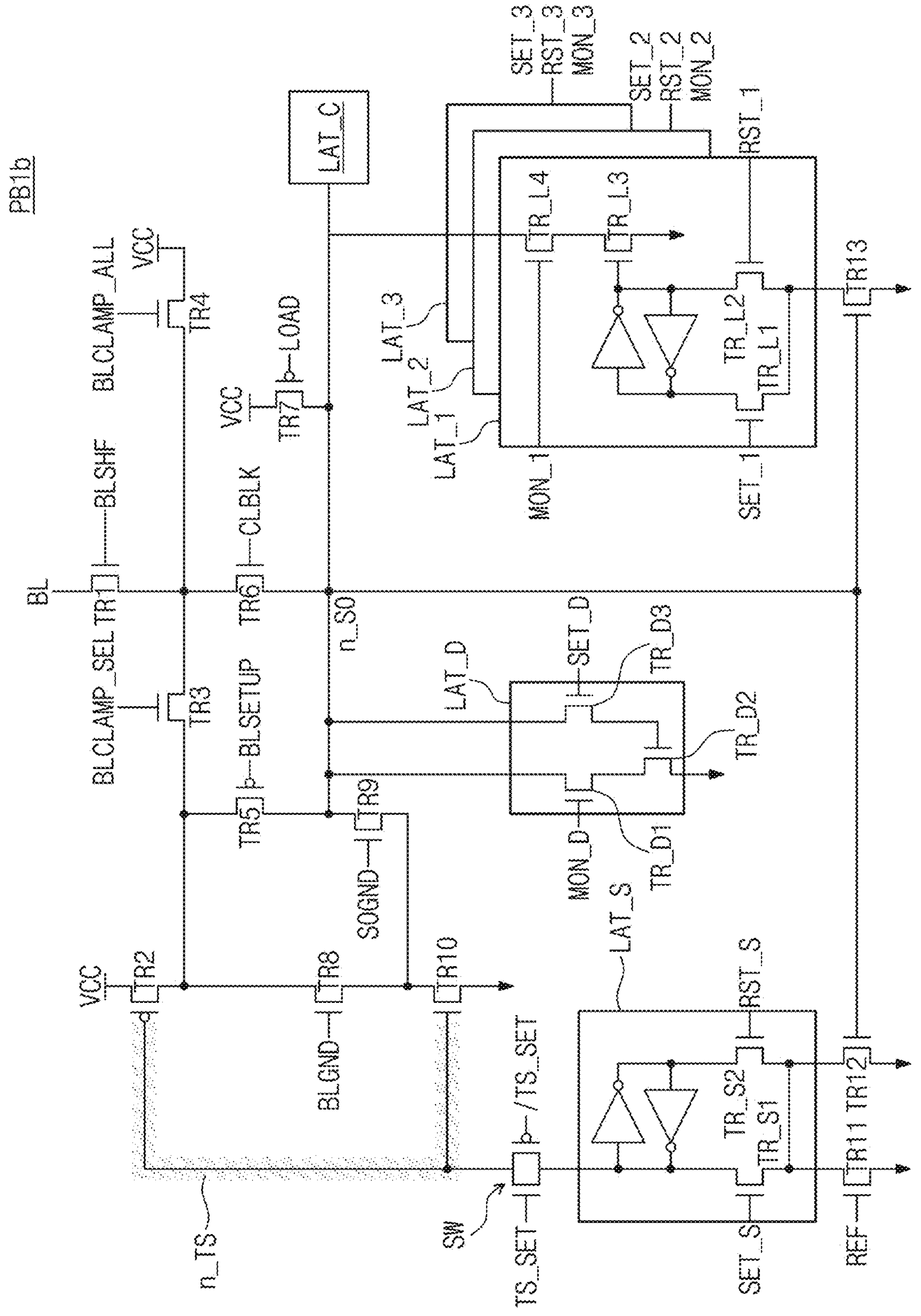
FIG. 15 is a circuit diagram illustrating one page buffer included in a page buffer circuit of FIG. 13.
Figure 16:
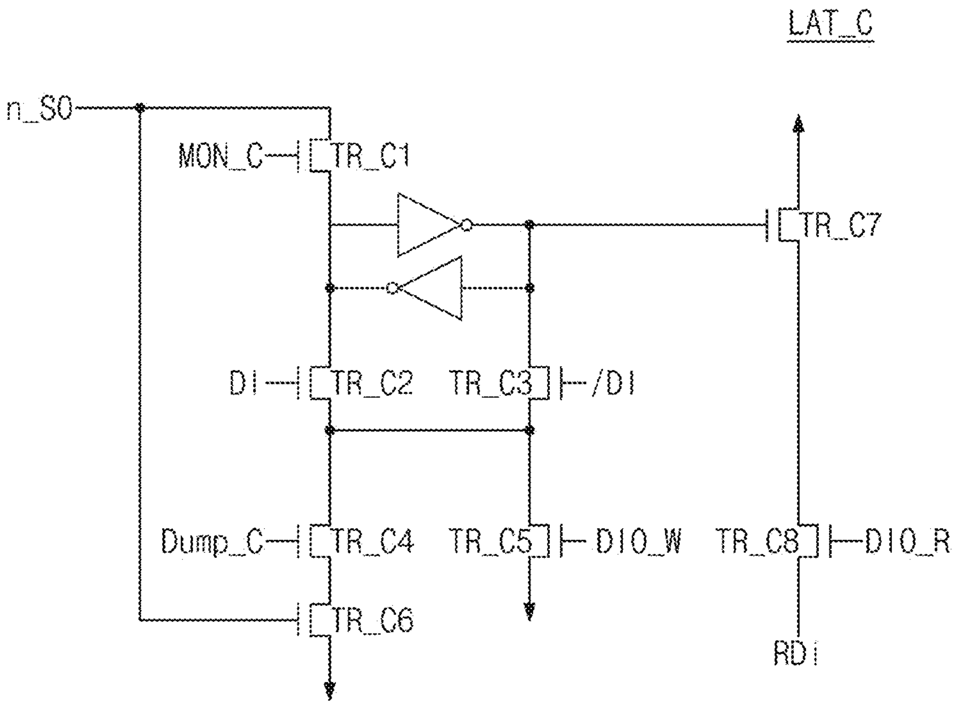

FIG. 15 is a circuit diagram illustrating one page buffer included in a page buffer circuit of FIG. 13. FIG. 16 is a circuit diagram illustrating a cache latch included in a first page buffer of FIG. 15. In some example embodiments, a first page buffer PB1*b* of FIG. 15 may be similar to the first page buffer PB1 of FIG. 6 except for some components. For convenience of description, additional description associated with the components described with reference to the first page buffer PB1 of FIG. 6 will be omitted to avoid redundancy.

Referring to FIGS. 15 and 16, the first page buffer PB1*b* may include the plurality of transistors TR1 to TR13, the switch SW, the sensing latch LAT_S, and the first to third latches LAT_1 to LAT_3. The plurality of transistors TR1 to TR13, the switch SW, the sensing latch LAT_S, and the first to third latches LAT_1 to LAT_3 are similar to those described with reference to FIG. 6, and thus, additional description will be omitted to avoid redundancy.

The first page buffer PB1*b* may further include the dynamic latch LAT_D. The dynamic latch LAT_D may be connected between the sensing node n_SO and the ground voltage. The dynamic latch LAT_D may include first to third dynamic latch transistors TR_D1, TR_D2, and TR_D3. The first and second dynamic latch transistors TR_D1 and TR_D2 may be connected in series between the sensing node n_SO and the ground voltage. The dynamic latch LAT_D may operate in response to a dynamic latch control signal MON_D. The third dynamic latch transistor TR_D3 may be connected between the sensing node n_SO and a gate of the second dynamic latch transistor TR_D2 and may operate in response to a dynamic latch set signal SET_D. The dynamic latch LAT_D may store data in response to the control signals MON_D and SET_D.

The first page buffer PB1*b* may further include a cache latch LAT_C connected with the sensing node n_SO. As illustrated in FIG. 16, the cache latch LAT_C may include two inverters and a plurality of cache latch transistors TR_C1 to TR_C8. The two inverters may have a cyclic (or latch) structure in which an input and an output of one inverter are respectively connected with an output and an input of the other inverter. The first cache latch transistor TR_C1 may be connected between the sensing node n_SO and a first node between the two inverters and may operate in response to a cache latch control signal MON_C. The second and third cache latch transistors TR_C2 and TR_C3 may be connected in series between the first node and a second node between the two inverters and may respectively operate in response to data signals DI and/DI. The fourth and sixth cache latch transistors TR_C4 and TR_C6 may be connected between a connection node of the second and third cache latch transistors TR_C2 and TR_C3 and the ground voltage and may respectively operate in response to a cache latch dump signal Dump_C and a level of the sensing node n_SO. The fifth cache latch transistor TR_C5 may be connected between the connection node of the second and third cache latch transistors TR_C2 and TR_C3 and the ground voltage and may operate in response to a write input signal DIO_W. The seventh and eighth cache latch transistors TR_C7 and TR_C8 may be connected in series between the ground voltage and a read signal RDi and may respectively operate in response to a level of the second node between the two inverters and a read input signal DIO_R.

In some example embodiments, the above circuit structure of the page buffer or the above circuit structure of the various components included in the page buffer is only an example, and example embodiments are not limited thereto.

Figure 17:
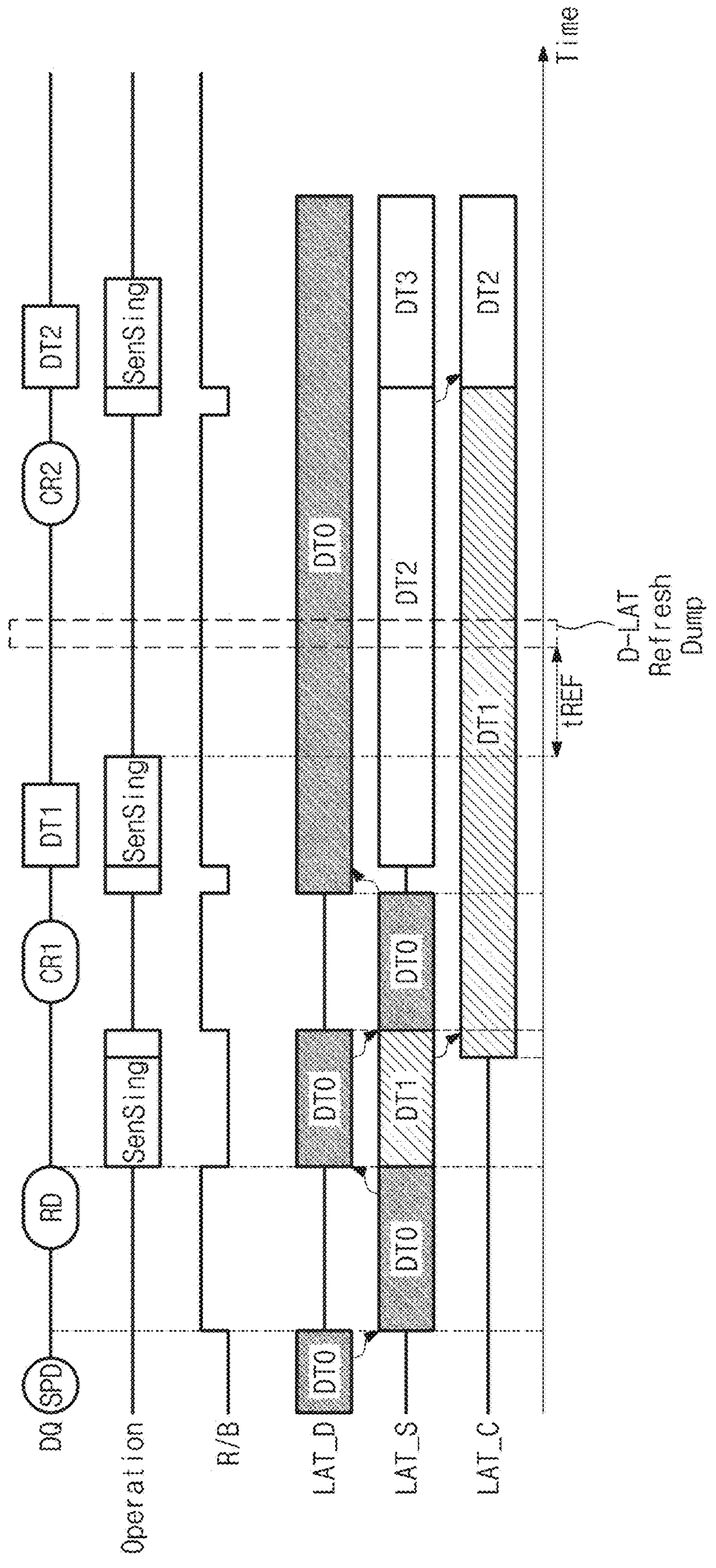
FIG. 17 is a flowchart illustrating an operation of a memory device of FIG. 13.

FIG. 17 is a flowchart illustrating an operation of a memory device of FIG. 13. To describe some example embodiments easily, a cache read operation of the memory device 1200 will be described. However, example embodiments are not limited thereto.

Referring to FIGS. 13 and 17, the memory device 1200 may receive a suspend command SPD from the memory controller 1100. The memory device 1200 may suspend an operation being performed, in response to the suspend command SPD. The memory device 1200 may store information about the suspended operation (e.g., suspend information) in the dynamic latch LAT_D of the page buffer circuit 1240.

In some example embodiments, the suspend information may be 0-th data DT0. The 0-th data DT0 (e.g., the suspend information) have to be maintained until the suspended operation is resumed. To this end, in consideration of a retention characteristic of the dynamic latch LAT_D, the 0-th data DT0 of the dynamic latch LAT_D may be dumped to the sensing latch LAT_S.

Before the suspended operation is resumed, the memory device 1200 may receive a read command RD from the memory controller 1100. The memory device 1200 may perform the read operation in response to the read command RD. In this case, because the sensing latch LAT_S is used for the read operation, the 0-th data DT0 (e.g., the suspend information) stored in the sensing latch LAT_S may be dumped to the dynamic latch LAT_D. Afterwards, the memory device 1200 may perform a sensing operation Sensing, and first data DT1 may be stored in the sensing latch LAT_S as a result of the sensing operation Sensing. After the sensing operation Sensing is completed, the memory device 1200 may perform a dump operation from the sensing latch LAT_S to the cache latch LAT_C. Because the first data DT1 of the sensing latch LAT_S moves to the cache latch LAT_C through the dump operation, the 0-th data DT0 stored in the dynamic latch LAT_D may be dumped to the sensing latch LAT_S.

Afterwards, the memory device 1200 may receive a first cache read command CR1 from the memory controller 1100. The memory device 1200 may perform the cache read operation in response to the first cache read command CR1. Because the sensing latch LAT_S is used for the cache read operation, the 0-th data DT0 stored in the sensing latch LAT_S may be dumped to the dynamic latch LAT_D. Afterwards, the memory device 1200 may perform a sensing operation Sensing, and second data DT2 may be stored in the sensing latch LAT_S as a result of the sensing operation Sensing. While the sensing operation Sensing is performed, the memory device 1200 may transmit the first data DT1 stored in the cache latch LAT_C to the memory controller 1100.

In the cache read operation, the sensing latch LAT_S may maintain the second data DT2 stored therein. Afterwards, the memory device 1200 may receive a second cache read command CR2 from the memory controller 1100. The memory device 1200 may dump the second data DT2 stored in the sensing latch LAT_S to the cache latch LAT_C in response to the second cache read command CR2. Afterwards, the memory device 1200 may perform a sensing operation Sensing, and third data DT3 may be stored in the sensing latch LAT_S as a result of the sensing operation Sensing. During the sensing operation Sensing, the memory device 1200 may output the second data DT2 stored in the cache latch LAT_C.

As described above, in the case where an operation of the memory device 1200 is suspended by the suspend command SPD, the suspend information has to be maintained by the page buffer circuit 1240. However, as illustrated in FIG. 17, in the case where a cache read operation is performed after the suspend command SPD is received, suspend information may be maintained by the dynamic latch LAT_D. However, due to a retention characteristic of the dynamic latch LAT_D, suspend information stored in the dynamic latch LAT_D may be lost.

To prevent the suspend information of the dynamic latch LAT_D from being lost, the memory device 1200 may perform the refresh dump operation on the dynamic latch LAT_D. For example, the control logic circuitry 1220 of the memory device 1200 may generate a refresh dump signal REF_DUMP after a reference time tREF from a time at which a sensing operation associated with the first cache read command CR1 is completed. In response to the refresh dump signal REF_DUMP, the page buffer circuit 1240 may perform the refresh dump operation on the dynamic latch LAT_D. The refresh dump operation may indicate an operation of repeating the following two times: a dump operation from the sensing latch LAT_S to the temporary storage node n_TS, a dump operation from the dynamic latch LAT_D to the sensing latch LAT_S, and a dump operation from the temporary storage node n_TS to the dynamic latch LAT_D. The refresh dump operation will be described in detail with reference to the following drawings.

In some example embodiments, the reference time tREF may be determined depending on a retention characteristic of the dynamic latch LAT_D. In some example embodiments, the control logic circuitry 1220 may determine whether the reference time tREF passes from a time at which the first cache read command CR1 is received or may determine whether the reference time tREF passes from a time at which the 0-th data DT0 are dumped to the dynamic latch LAT_D.

In some example embodiments, in the case where a time during which the 0-th data DT0 are maintained in the dynamic latch LAT_D increases, the memory device 1200 may perform a plurality of refresh dump operations every reference time tREF.

Figure 18:
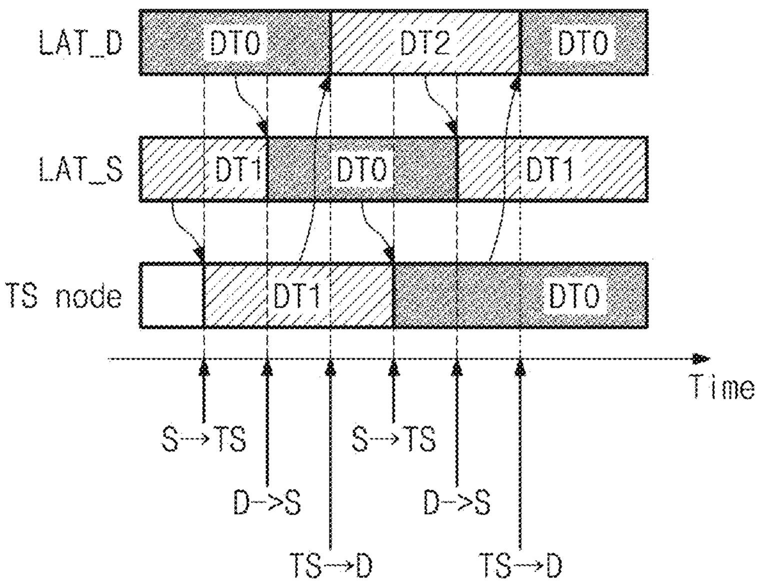
FIG. 18 is a timing diagram for describing a refresh dump operation of FIG. 17.
Figure 19:
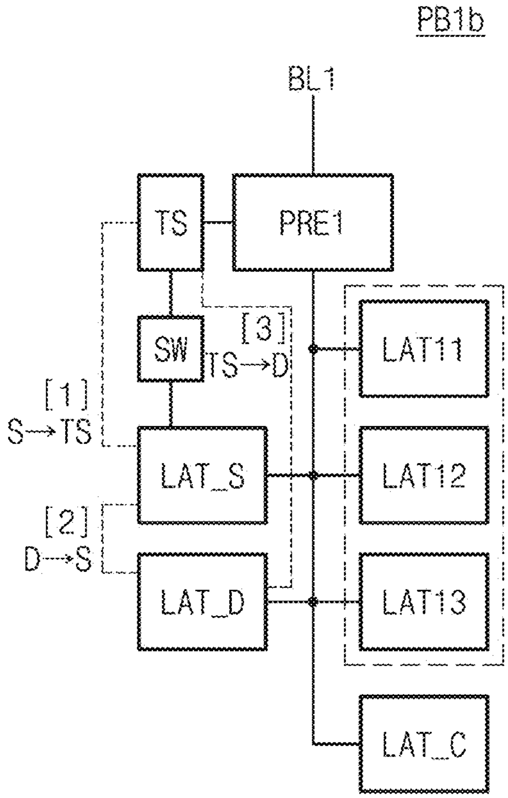
FIG. 19 is a diagram for describing an operation according to the flowchart of FIG. 18.

FIG. 18 is a timing diagram for describing a refresh dump operation of FIG. 17. FIG. 19 is a diagram for describing an operation according to the flowchart of FIG. 18. For convenience of description, the refresh dump operation for the dynamic latch LAT_D will be described with reference to the first page buffer PB1*b*.

Referring to FIGS. 15, 17, 18, and 19, the first page buffer PB1*b* of the memory device 1200 may include the plurality of latches LAT1 to LAT3, the cache latch LAT_C, the sensing latch LAT_S, the dynamic latch LAT_D, the switch SW, the temporary storage node TS, and the precharge circuit PRE1. The plurality of latches LAT1 to LAT3, the cache latch LAT_C, the sensing latch LAT_S, the dynamic latch LAT_D, the switch SW, and the temporary storage node TS are similar in structure to those of the first page buffer PB1*b* described with reference to FIG. 15, and thus, additional description will be omitted to avoid redundancy. The precharge circuit PRE1 may include the remaining components of the first page buffer PB1*b* described with reference to FIG. 15, and thus, additional description will be omitted to avoid redundancy.

The memory device 1200 may perform the refresh dump operation through the dump operations between the sensing latch LAT_S, the temporary storage node TS, and the dynamic latch LAT_D. For example, the dynamic latch LAT_D may store the 0-th data DT0 (e.g., suspend information), the sensing latch LAT_S may store the first data DT1 (e.g., data to be maintained for a cache read operation).

First, like operation [1] of FIG. 19, as the dump operation from the sensing latch LAT_S to the temporary storage node TS is performed (S→TS), the first data DT1 may be stored at the temporary storage node TS. Next, like operation [2] of FIG. 19, as the dump operation from the dynamic latch LAT_D to the sensing latch LAT_S is performed (D→S), the 0-th data DT0 may be stored at the sensing latch LAT_S. Then, like operation [3] of FIG. 19, as the dump operation from the temporary storage node TS to the dynamic latch LAT_D is performed (TS→D), the first data DT1 may be stored at the dynamic latch LAT_D.

Afterwards, as illustrated in the timing diagram of FIG. 18, the three dump operations S→TS, D→S, and TS→D described above may be again performed. In this case, the 0-th data DT0 may be stored at the temporary storage node TS through the dump operation (S→TS) from the sensing latch LAT_S to the temporary storage node TS; the first data DT1 may be stored in the sensing latch LAT_S through the dump operation (D→S) from the dynamic latch LAT_D to the sensing latch LAT_S; the 0-th data DT0 may be stored in the dynamic latch LAT_D through the dump operation (TS→D) from the temporary storage node TS to the dynamic latch LAT_D.

As described above, through repetitive dump operations between the sensing latch LAT_S, the temporary storage node TS, and the dynamic latch LAT_D, the retention characteristic of the dynamic latch LAT_D may be initialized (e.g., a data retention time may be initialized) in a state where data of the sensing latch LAT_S and the dynamic latch LAT_D are maintained.

Figure 20:
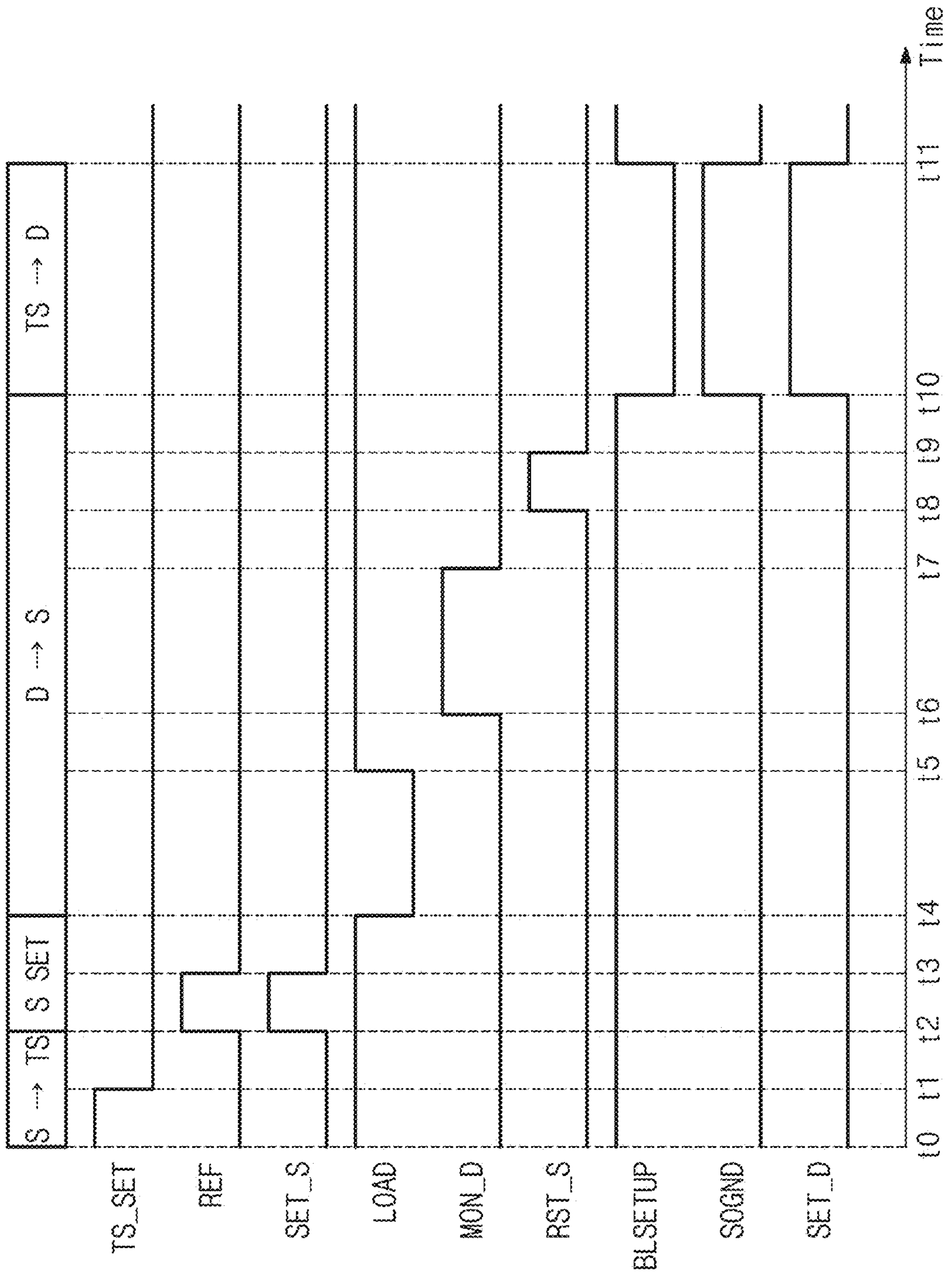
FIG. 20 is a timing diagram for describing a refresh dump operation of FIG. 19.

FIG. 20 is a timing diagram for describing a refresh dump operation of FIG. 19. For brevity of drawing and convenience of description, one cycle including three dump operations (e.g., S→TS, D→S, and TS→D) will be described. However, example embodiments are not limited thereto. For example, the memory device 1200 may repeatedly perform two cycles each including the dump operations according to the timing diagram illustrated in FIG. 20.

Referring to FIGS. 13, 15, 19, and 20, the memory device 1200 may perform the dump operation (S→TS) from the sensing latch LAT_S to the temporary storage node TS during a period from t0 to t2. For example, during the period from t0 to t2, the refresh signal REF, the sensing set signal SET_S, the dynamic latch control signal MON_D, the sensing reset signal RST_S, and the sensing node ground signal SOGND, and the dynamic latch set signal SET_D may be at the low level, and the bit line setup signal BLSETUP may be at the high level. The temporary storage node setup signal TS_SET may be at the high level during a period from t0 to t1 and may maintain the low level after point in time t2. A value of the sensing latch LAT_S may be transferred to, moved to, or stored at the temporary storage node TS depending on the levels of the above signals.

Afterwards, during a period from t2 to t4, the memory device 1200 may perform a set operation "S SET" on the sensing latch LAT_S. For example, the refresh signal REF and the sensing set signal SET_S may have the high level during a period from t2 to t3. As such, a value of the sensing latch LAT_S may be set to a specific value. The levels of the remaining signals may maintain the levels in the dump operation (S→TS) described above, and thus, additional description will be omitted to avoid redundancy.

Afterwards, during a period from t4 to t10, the memory device 1200 may perform the dump operation (D→S) from the dynamic latch LAT_D to the sensing latch LAT_S. For example, during a period from t4 to t5, the load signal LOAD may have the low level, and in this case, the sensing node n_SO may be charged with the power supply voltage VCC. Afterwards, during a period from t6 to t7, the dynamic latch control signal MON_D may have the high level, and in this case, a level of the sensing node n_SO may change depending on a value of the dynamic latch LAT_D (i.e., a value of the dynamic latch LAT_D being transferred to the sensing node n_SO). Afterwards, during a period from t8 to t9, the sensing reset signal RST_S may have the high level, and in this case, a level of the sensing latch LAT_S may be determined depending on a value of the sensing node n_SO. A value of the dynamic latch LAT_D may be dumped to the sensing latch LAT_S depending on the above signal levels. In the above dump operation (D→S), levels of some signals are the same as the levels in the above operation "S SET", and thus, additional description will be omitted to avoid redundancy.

Afterwards, during a period from t10 to t11, the memory device 1200 may perform the dump operation (TS→D) from the temporary storage node TS to the dynamic latch LAT_D. For example, during the period from t10 to t11, the bit line setup signal BLSETUP may have the low level, the sensing node ground signal SOGND may have the high level, and the dynamic latch set signal SET_D may have the high level. As such, a level of the sensing node n_SO may change depending on a level of the temporary storage node TS, and the dynamic latch LAT_D may be set based on the level of the sensing node n_SO.

The memory device 1200 may perform the refresh dump operation on the dynamic latch LAT_D by repeatedly performing the dump operations described with reference to FIG. 20. Through the refresh dump operation, the retention characteristic for data of the dynamic latch LAT_D may be initialized, and values of the dynamic latch LAT_D and the sensing latch LAT_S may be maintained.

Figure 21:
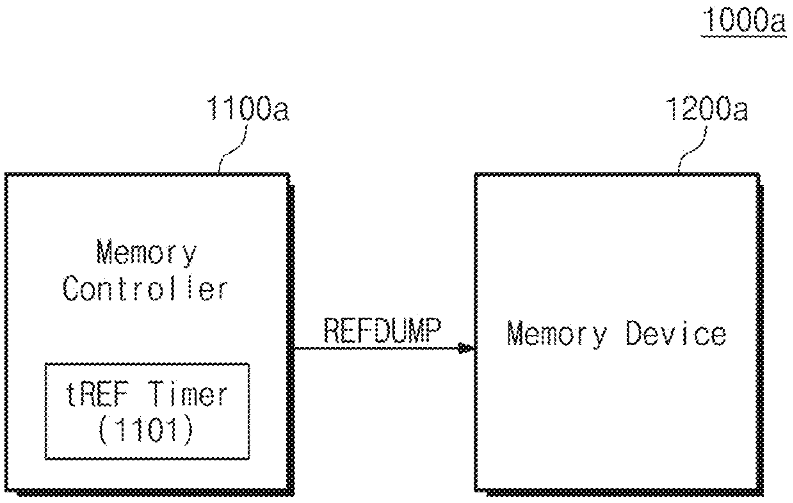
FIG. 21 is a block diagram illustrating a memory system according to some example embodiments.

FIG. 21 is a block diagram illustrating a memory system according to some example embodiments. For convenience of description, additional description associated with the components described above will be omitted to avoid redundancy. Referring to FIG. 21, a memory system 1000*a* may include a memory controller 1100*a* and a memory device 1200*a*. Configurations and operations of the memory controller 1100*a* and the memory device 1200*a* are similar to those described above, and thus, additional description will be omitted to avoid redundancy.

The memory controller 1100*a* may include a reference time timer 1101. The reference time timer 1101 may be configured to measure a timing for the memory device 1200*a* to perform the refresh dump operation of the dynamic latch LAT_D. For example, after transmitting the suspend command SPD to the memory device 1200*a*, the reference time timer 1101 may measure an elapsed time from a time at which a read command is issued; when the elapsed time reaches the reference time tREF, the reference time timer 1101 may transmit a refresh dump command REFDUMP to the memory device 1200*a*. The memory device 1200*a* may perform the refresh dump operation on the dynamic latch LAT_D in response to the refresh dump command REFDUMP from the memory controller 1100*a*. The refresh dump operation associated with the dynamic latch LAT_D is similar to that described above, and thus; additional description will be omitted to avoid redundancy.

Figure 22:
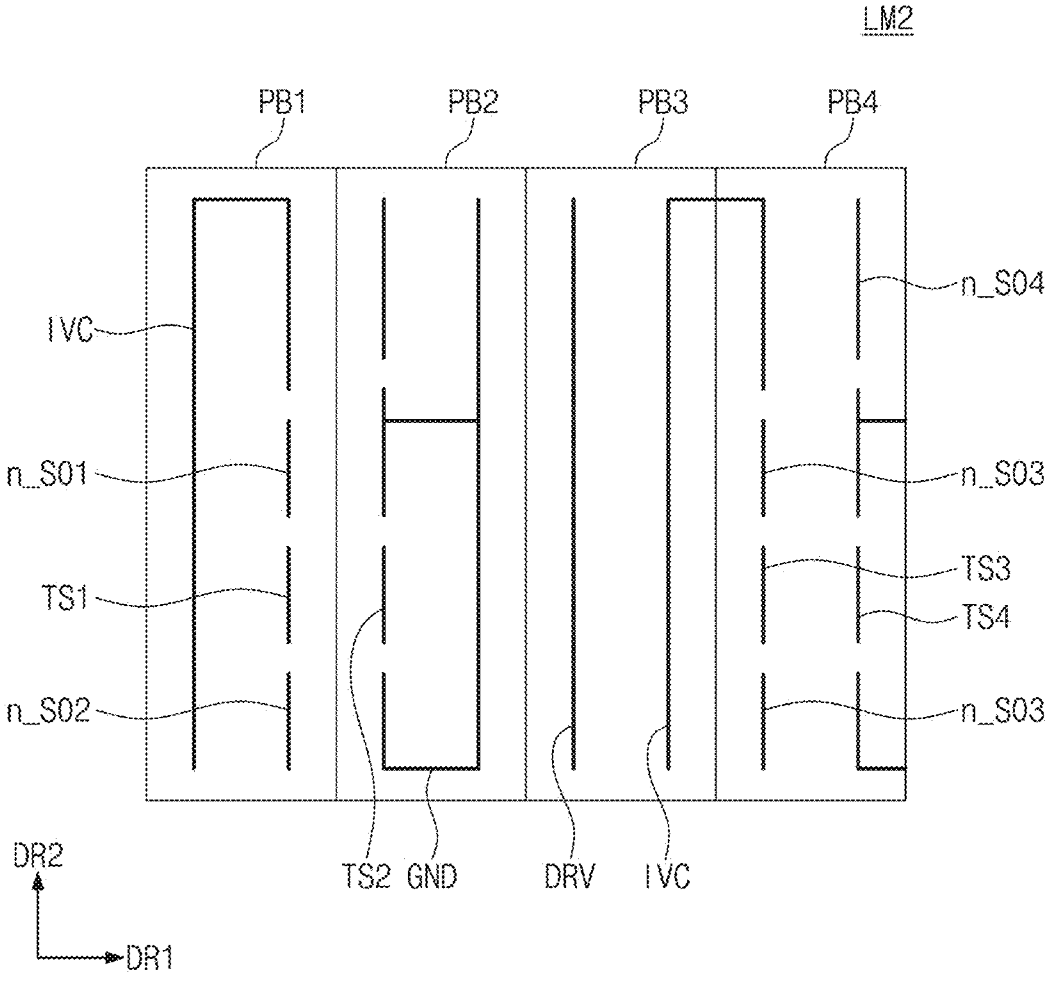
FIG. 22 is a plan view illustrating a metal layer corresponding to a page buffer circuit according to some example embodiments.
Figure 23A:
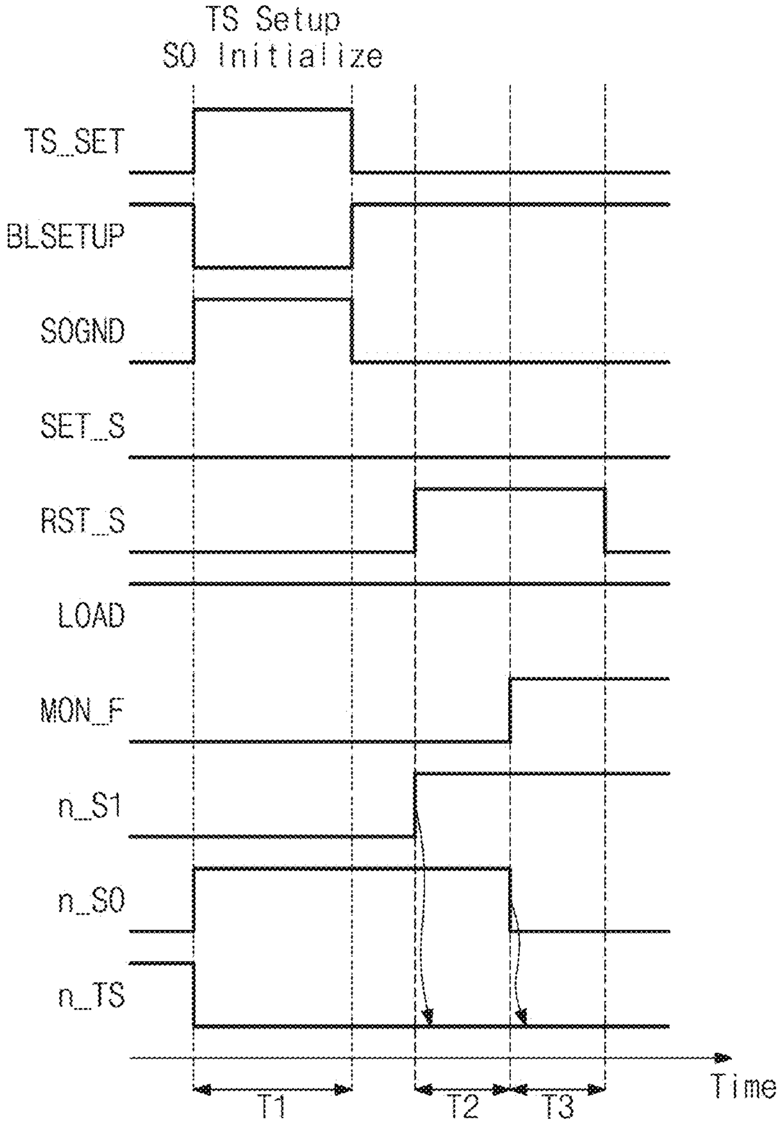
FIGS. 23A and 23B are timing diagrams for describing an operation of a page buffer circuit having a metal layer of FIG. 22.
Figure 23B:
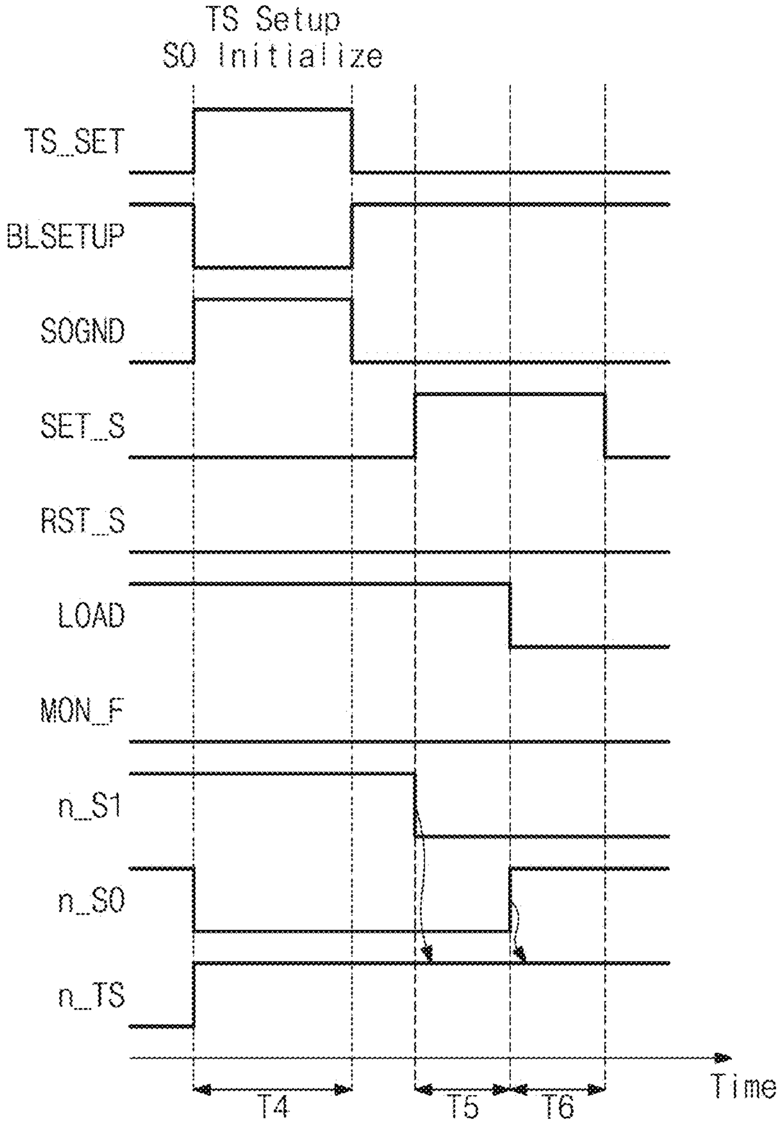

FIG. 22 is a plan view illustrating a metal layer corresponding to a page buffer circuit according to some example embodiments. FIGS. 23A and 23B are timing diagrams for describing an operation of a page buffer circuit having a metal layer of FIG. 22. For convenience of description, it is assumed that a page buffer circuit corresponding to a second metal layer LM2 of FIG. 22 includes the first page buffer PB1*a* of FIG. 11.

Referring to FIGS. 5, 11, 22, 23A, and 23B, the page buffer circuit 140 may include the first to fourth page buffers PB1, PB2, PB3, and PB4. The first to fourth page buffers PB1 to PB4 may be connected with the second metal layer LM2 formed on a plane defined by a first direction DR1 and a second direction DR2.

For example, the first to fourth page buffers PB1 to PB4 may be arranged along the first direction DR1. In the second metal layer LM2, a region corresponding to the first page buffer PB1 may include an internal power line IVC, a first sensing node n_SO1, a second sensing node n_SO2, and a first temporary storage node TS1. In the second metal layer LM2, a region corresponding to the second page buffer PB2 may include a ground voltage line GND and a second temporary storage node TS2. In the second metal layer LM2, a region corresponding to the third page buffer PB3 may include an internal voltage line IVC and a driving voltage line DRV. In the second metal layer LM2, a region corresponding to the fourth page buffer PB4 may include a third sensing node n_SO3, a fourth sensing node n_SO4, a third temporary storage node TS3, and a fourth temporary storage node TS4.

In some example embodiments, the first sensing node n_SO1 and the first temporary storage node TS1 may be nodes corresponding to the first page buffer PB1; the second sensing node n_SO2 and the second temporary storage node TS2 may be nodes corresponding to the second page buffer PB2; the third sensing node n_SO3 and the third temporary storage node TS3 may be nodes corresponding to the third page buffer PB3; the fourth sensing node n_SO4 and the fourth temporary storage node TS4 may be nodes corresponding to the fourth page buffer PB4.

As illustrated in FIG. 22, temporary storage nodes belonging to adjacent page buffers from among the temporary storage nodes TS1, TS2, TS3, and TS4 may be disposed to face each other in the first direction DR1, or each of the temporary storage nodes TS1, TS2, TS3, and TS4 may be disposed not to face a sensing node belonging to an adjacent page buffer from among the sensing nodes n_SO1 to n_SO4. This is for minimizing a level change of a sensing node due to the coupling of peripheral metal lines.

Also, as illustrated in FIGS. 23A and 23B, the above coupling may be minimized by initializing a sensing node when a setup operation is performed on a temporary storage node.

For example, as illustrated in FIGS. 23A and 23B, during a first time T1 or a fourth time T4, a setup operation associated with the temporary storage node TS may be performed. The setup operation associated with the temporary storage node TS may indicate the dump operation from the sensing latch LAT_S to the temporary storage node n_TS. During the first time T1 or the fourth time T4, the temporary storage node set signal TS_SET may have the high level. In this case, as illustrated in FIG. 23A, when a value of a first node (or first sensing latch node) n_S1 of the sensing latch LAT_S corresponds to the low level, the temporary storage node n_TS may have the low level. Alternatively, as illustrated in FIG. 23B, when a value of the first node (or first sensing latch node) n_S1 of the sensing latch LAT_S corresponds to the high level, the temporary storage node n_TS may have the high level.

During the setup operation of the temporary storage node n_TS (e.g., during the first time T1), the bit line setup signal BLSETUP may have the low level, and the sensing node ground signal SOGND may have the high level. In this case, a level of the sensing node n_SO may be initialized depending on a level of the temporary storage node n_TS. For example, as illustrated in FIG. 23A, when the temporary storage node n_TS is at the low level, the sensing node n_SO may have the high level. Alternatively, as illustrated in FIG. 23B, when the temporary storage node n_TS is at the high level, the sensing node n_SO may have the low level.

As described above, in the case where the sensing node n_SO is initialized together with the setup operation of the temporary storage node n_TS, the coupling to the temporary storage node n_TS may decrease. For example, as illustrated in FIG. 23A, in the case where the temporary storage node n_TS has the low level and the sensing node n_SO is initialized to the high level, even though a level of the first sensing latch node n_S1 is changed due to a transition of the sensing reset signal RST_S to the high level (refer to a second time T2), the coupling to the temporary storage node n_TS may be slight. Also, referring to a third time T3, as the F-latch control signal MON_F transitions to the high level, a level of the sensing node n_SO may be changed from the high level to the low level. In this case, the coupling due to the level change may be slight because the temporary storage node n_TS has the low level.

In contrast, as illustrated in FIG. 23B, in the case where the temporary storage node n_TS has the high level and the sensing node n_SO is initialized to the low level, even though a level of the first sensing latch node n_S1 is changed due to a transition of the sensing set signal SET_S to the high level (refer to a fifth time T5), the coupling to the temporary storage node n_TS may be slight. Also, referring to a sixth time T6, as the load signal LOAD transitions to the low level, a level of the sensing node n_SO may be changed from the low level to the high level. In this case, the coupling due to the level change may be slight because the temporary storage node n_TS has the high level. That is, as described above, the coupling to a temporary storage node may decrease by disposing a temporary storage node so as not to face a sensing node of an adjacent page buffer in the first direction DR1 and initializing the sensing node when a setup operation is performed on the temporary storage node. Accordingly, the reliability of data retention of a temporary storage node is improved.

Figure 24:
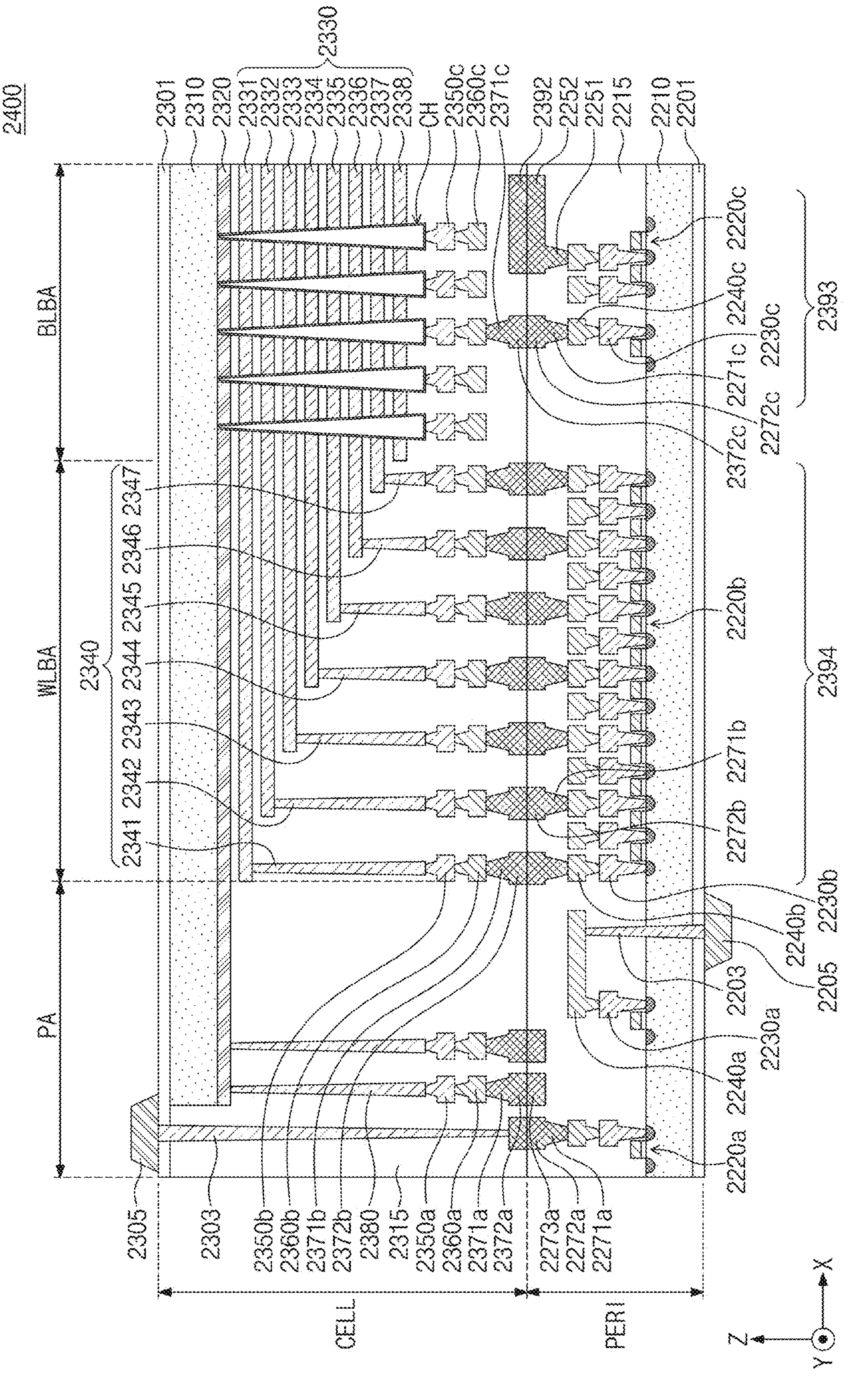
FIG. 24 is a view illustrating a memory device according to another embodiment of the present disclosure.

FIG. 24 is a diagram illustrating a memory device 2600 according to another example embodiment.

Referring to FIG. 24, a memory device 2600 may have a chip-to-chip (C2C) structure. The C2C structure may refer to a structure formed by manufacturing an upper chip including a cell region CELL on a first substrate or wafer, manufacturing a lower chip including a peripheral circuit region PERI on a second substrate wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. Example embodiment, however, may not be limited thereto. For example, the bonding metals may alternatively or also be formed of aluminum (Al) and/or tungsten (W).

Each of the peripheral circuit region PERI and the cell region CELL of the memory device 2600 may include an external pad bonding area PA, a word line bonding area WLBA, and a bit line bonding area BLBA.

The peripheral circuit region PERI may include a first substrate 2710, an interlayer insulating layer 2715, a plurality of circuit elements 2720*a*, 2720*b*, and 2720*c* formed on the first substrate 2710, first metal layers 2730*a*, 2730*b*, and 2730*c* respectively connected to the plurality of circuit elements 2720*a*, 2720*b*, and 2720*c*, and second metal layers 2740*a*, 2740*b*, and 2740*c* formed on the first metal layers 2730*a*, 2730*b*, and 2730*c*. In some example embodiments, the first metal layers 2730*a*, 2730*b*, and 2730*c* may be formed of tungsten having relatively high electrical resistivity, and the second metal layers 2740*a*, 2740*b*, and 2740*c* may be formed of copper having relatively low electrical resistivity.

In some example embodiments as illustrate in FIG. 24, although only the first metal layers 2730*a*, 2730*b*, and 2730*c* and the second metal layers 2740*a*, 2740*b*, and 2740*c* are shown and described, the example embodiment is not limited thereto, and one or more additional metal layers may be further formed on the second metal layers 2740*a*, 2740*b*, and 2740*c*. At least a portion of the one or more additional metal layers formed on the second metal layers 2740*a*, 2740*b*, and 2740*c* may be formed of aluminum or the like having a lower electrical resistivity than those of copper forming the second metal layers 2740*a*, 2740*b*, and 2740*c*.

The interlayer insulating layer 2715 may be disposed on the first substrate 2710 and cover the plurality of circuit elements 2720*a*, 2720*b*, and 2720*c*, the first metal layers 2730*a*, 2730*b*, and 2730*c*, and the second metal layers 2740*a*, 2740*b*, and 2740*c*. The interlayer insulating layer 2715 may include an insulating material such as silicon oxide, silicon nitride, or the like.

Lower bonding metals 2771*b* and 2772*b* may be formed on the second metal layer 2740*b* in the word line bonding area WLBA. In the word line bonding area WLBA, the lower bonding metals 2771*b* and 2772*b* in the peripheral circuit region PERI may be electrically bonded to upper bonding metals 2871*b* and 2872*b* of the cell region CELL. The lower bonding metals 2771*b* and 2772*b* and the upper bonding metals 2871*b* and 2872*b* may be formed of aluminum, copper, tungsten, or the like. Further, the upper bonding metals 2871*b* and 2872*b* in the cell region CELL may be referred as first metal pads and the lower bonding metals 2771*b* and 2772*b* in the peripheral circuit region PERI may be referred as second metal pads.

The cell region CELL may include at least one memory block. The cell region CELL may include a second substrate 2810 and a common source line 2820. On the second substrate 2810, a plurality of word lines 2831 to 2838 (e.g., 2830) may be stacked in a direction (a Z-axis direction), perpendicular to an upper surface of the second substrate 2810. At least one string select line and at least one ground select line may be arranged on and below the plurality of word lines 2830, respectively, and the plurality of word lines 2830 may be disposed between the at least one string select line and the at least one ground select line.

In the bit line bonding area BLBA, a channel structure CH may extend in a direction (a Z-axis direction), perpendicular to the upper surface of the second substrate 2810, and pass through the plurality of word lines 2830, the at least one string select line, and the at least one ground select line. The channel structure CH may include a data storage layer, a channel layer, a buried insulating layer, and the like, and the channel layer may be electrically connected to a first metal layer 2850*c* and a second metal layer 2860*c*. For example, the first metal layer 2850*c* may be a bit line contact, and the second metal layer 2860*c* may be a bit line. In some example embodiments, the bit line 2860*c* may extend in a first direction (a Y-axis direction), parallel to the upper surface of the second substrate 2810.

In some example embodiments illustrated in FIG. 24, an area in which the channel structure CH, the bit line 2860*c*, and the like are disposed may be defined as the bit line bonding area BLBA. In the bit line bonding area BLBA, the bit line 2860*c* may be electrically connected to the circuit elements 2720*c* providing a page buffer 2893 in the peripheral circuit region PERI. The bit line 2860*c* may be connected to upper bonding metals 2871*c* and 2872*c* in the cell region CELL, and the upper bonding metals 2871*c* and 2872*c* may be connected to lower bonding metals 2771*c* and 2772*c* connected to the circuit elements 2720*c* of the page buffer 2893. In some example embodiments, a program operation may be executed based on a page unit as write data of the page-unit is stored in the page buffer 2893, and a read operation may be executed based on a sub-page unit as read data of the sub-page unit is stored in the page buffer 2893.

Also, in the program operation and the read operation, units of data transmitted through bit lines may be different from each other.

In the word line bonding area WLBA, the plurality of word lines 2830 may extend in a second direction (an X-axis direction), parallel to the upper surface of the second substrate 2810 and perpendicular to the first direction, and may be connected to a plurality of cell contact plugs 2841 to 2847 (e.g., 2840). The plurality of word lines 2830 and the plurality of cell contact plugs 2840 may be connected to each other in pads provided by at least a portion of the plurality of word lines 2830 extending in different lengths in the second direction. A first metal layer 2850*b* and a second metal layer 2860*b* may be connected to an upper portion of the plurality of cell contact plugs 2840 connected to the plurality of word lines 2830, sequentially. The plurality of cell contact plugs 2840 may be connected to the peripheral circuit region PERI by the upper bonding metals 2871*b* and 2872*b* of the cell region CELL and the lower bonding metals 2771*b* and 2772*b* of the peripheral circuit region PERI in the word line bonding area WLBA.

The plurality of cell contact plugs 2840 may be electrically connected to the circuit elements 2720*b* forming a row decoder 2894 in the peripheral circuit region PERI. In some example embodiments, operating voltages of the circuit elements 2720*b* of the row decoder 2894 may be different than operating voltages of the circuit elements 2720*c* forming the page buffer 2893. For example, operating voltages of the circuit elements 2720*c* forming the page buffer 2893 may be greater than operating voltages of the circuit elements 2720*b* forming the row decoder 2894.

A common source line contact plug 2880 may be disposed in the external pad bonding area PA. The common source line contact plug 2880 may be formed of a conductive material such as a metal, a metal compound, polysilicon, or the like, and may be electrically connected to the common source line 2820. A first metal layer 2850*a* and a second metal layer 2860*a* may be stacked on an upper portion of the common source line contact plug 2880, sequentially. For example, an area in which the common source line contact plug 2880, the first metal layer 2850*a*, and the second metal layer 2860*a* are disposed may be defined as the external pad bonding area PA.

Input-output pads 2705 and 2805 may be disposed in the external pad bonding area PA. Referring to FIG. 24, a lower insulating film 2701 covering a lower surface of the first substrate 2710 may be formed below the first substrate 2710, and a first input-output pad 2705 may be formed on the lower insulating film 2701. The first input-output pad 2705 may be connected to at least one of the plurality of circuit elements 2720*a*, 2720*b*, and 2720*c* disposed in the peripheral circuit region PERI through a first input-output contact plug 2703, and may be separated from the first substrate 2710 by the lower insulating film 2701. In addition, a side insulating film may be disposed between the first input-output contact plug 2703 and the first substrate 2710 to electrically separate the first input-output contact plug 2703 and the first substrate 2710.

Referring to FIG. 24, an upper insulating film 2801 covering the upper surface of the second substrate 2810 may be formed on the second substrate 2810, and a second input-output pad 2805 may be disposed on the upper insulating layer 2801. The second input-output pad 2805 may be connected to at least one of the plurality of circuit elements 2720*a*, 2720*b*, and 2720*c* disposed in the peripheral circuit region PERI through a second input-output contact plug 2803. In some example embodiments, the second input-output pad 2805 is electrically connected to a circuit element 2720*a*.

According to various example embodiments, the second substrate 2810 and the common source line 2820 may not be disposed in an area in which the second input-output contact plug 2803 is disposed. Also, the second input-output pad 2805 may not overlap the word lines 2830 in the third direction (the Z-axis direction). Referring to FIG. 24, the second input-output contact plug 303 may be separated from the second substrate 2810 in a direction, parallel to the upper surface of the second substrate 2810, and may pass through the interlayer insulating layer 2815 of the cell region CELL to be connected to the second input-output pad 2805.

According to various example embodiments, the first input-output pad 2705 and the second input-output pad 2805 may be selectively formed. For example, the memory device 2600 may include only the first input-output pad 2705 disposed on the first substrate 2710 or the second input-output pad 2805 disposed on the second substrate 2810. Alternatively, the memory device 2600 may include both the first input-output pad 2705 and the second input-output pad 2805.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2600 may include a lower metal pattern 2773*a*, corresponding to an upper metal pattern 2872*a* formed in an uppermost metal layer of the cell region CELL, and having the same cross-sectional shape as the upper metal pattern 2872*a* of the cell region CELL so as to be connected to each other, in an uppermost metal layer of the peripheral circuit region PERI. In the peripheral circuit region PERI, the lower metal pattern 2773*a* formed in the uppermost metal layer of the peripheral circuit region PERI may not be connected to a contact. Similarly, in the external pad bonding area PA, an upper metal pattern 2872*a*, corresponding to the lower metal pattern 2773*a* formed in an uppermost metal layer of the peripheral circuit region PERI, and having the same shape as a lower metal pattern 2773*a* of the peripheral circuit region PERI, may be formed in an uppermost metal layer of the cell region CELL.

The lower bonding metals 2771*b* and 2772*b* may be formed on the second metal layer 2740*b* in the word line bonding area WLBA. In the word line bonding area WLBA, the lower bonding metals 2771*b* and 2772*b* of the peripheral circuit region PERI may be electrically connected to the upper bonding metals 2871*b* and 2872*b* of the cell region CELL by a Cu-to-Cu bonding.

Further, in the bit line bonding area BLBA, an upper metal pattern 2892, corresponding to a lower metal pattern 2752 formed in the uppermost metal layer of the peripheral circuit region PERI, and having the same cross-sectional shape as the lower metal pattern 2752 of the peripheral circuit region PERI, may be formed in an uppermost metal layer of the cell region CELL. A contact may not be formed on the upper metal pattern 2892 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In some example embodiments, the page buffer circuit 140 and/or the page buffers accordingly may be included in the peripheral circuit area PERI of FIG. 24.

Figure 25:
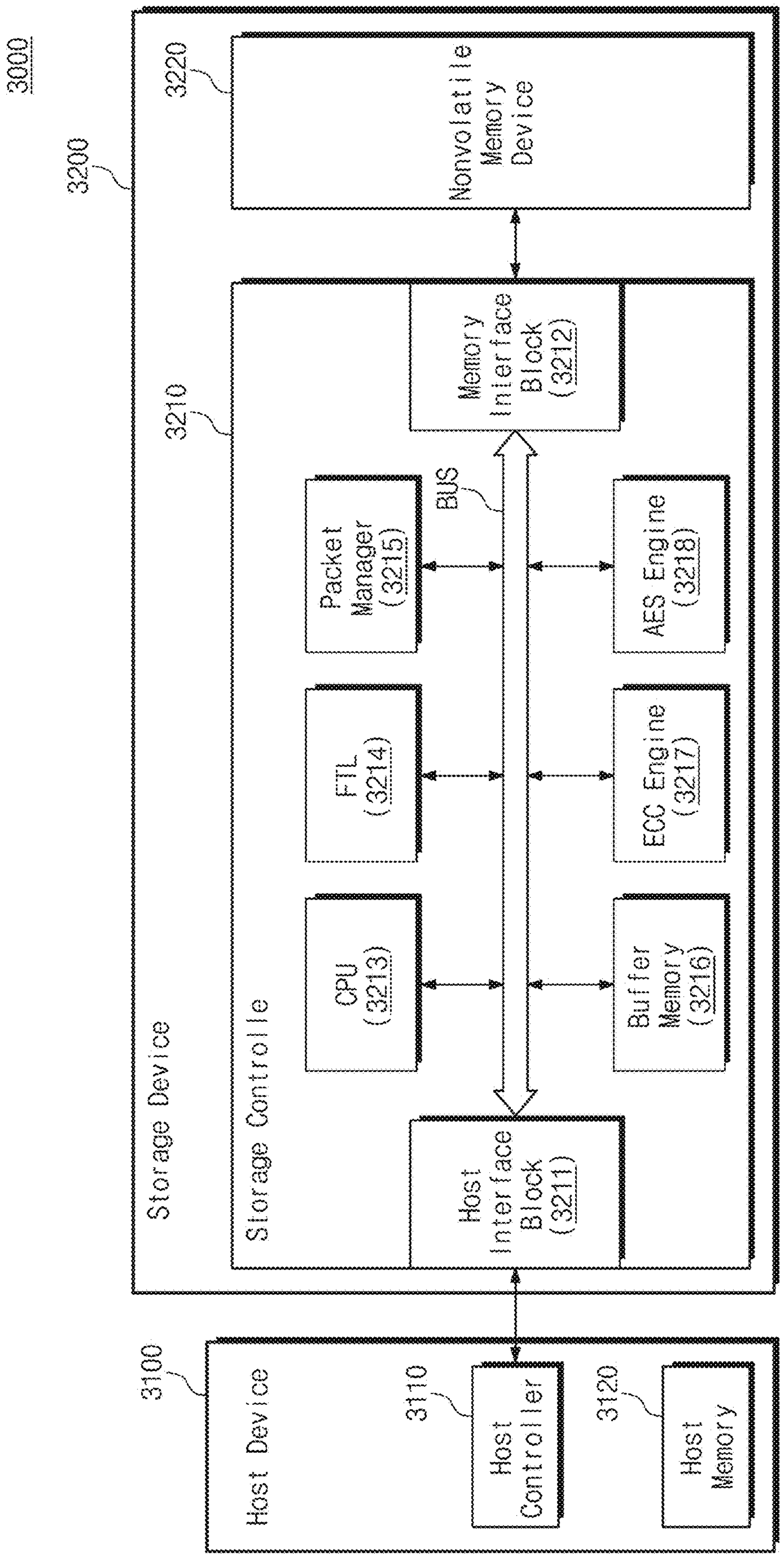
FIG. 25 is a block diagram illustrating a host-storage system according to some example embodiments.

FIG. 25 is a block diagram of a host storage system 3000 according to some example embodiments.

The host storage system 3000 may include a host 3100 and a storage device 3200. Further, the storage device 3200 may include a storage controller 3210 and an NVM 3220. According to some example embodiments, the host 3100 may include a host controller 3110 and a host memory 3120. The host memory 3120 may serve as a buffer memory configured to temporarily store data to be transmitted to the storage device 3200 or data received from the storage device 3200.

The storage device 3200 may include storage media configured to store data in response to requests from the host 3100. As an example, the storage device 3200 may include at least one of an SSD, an embedded memory, and a removable external memory. When the storage device 3200 is an SSD, the storage device 3200 may be a device that conforms to an NVMe standard. When the storage device 3200 is an embedded memory or an external memory, the storage device 3200 may be a device that conforms to a UFS standard or an eMMC standard. Each of the host 3100 and the storage device 3200 may generate a packet according to an adopted standard protocol and transmit the packet.

When the NVM 3220 of the storage device 3200 includes a flash memory, the flash memory may include a 32D NAND memory array or a 3D (or vertical) NAND (VNAND) memory array. As another example, the storage device 3200 may include various other kinds of NVMs. For example, the storage device 3200 may include magnetic RAM (MRAM), spin-transfer torque MRAM, conductive bridging RAM (CBRAM), ferroelectric RAM (FRAM), PRAM, RRAM, and various other kinds of memories.

According to some example embodiments, the host controller 3110 and the host memory 3120 may be implemented as separate semiconductor chips. Alternatively, in some example embodiments, the host controller 3110 and the host memory 3120 may be integrated in the same semiconductor chip. As an example, the host controller 3110 may be any one of a plurality of modules included in an application processor (AP). The AP may be implemented as a System on Chip (SoC). Further, the host memory 3120 may be an embedded memory included in the AP or an NVM or memory module located outside the AP.

The host controller 3110 may manage an operation of storing data (e.g., write data) of a buffer region of the host memory 3120 in the NVM 3220 or an operation of storing data (e.g., read data) of the NVM 3220 in the buffer region.

The storage controller 3210 may include a host interface 3211, a memory interface 3212, and a CPU 3213. Further, the storage controllers 3210 may further include a flash translation layer (FTL) 3214, a packet manager 3215, a buffer memory 3216, an error correction code (ECC) engine 3217, and an advanced encryption standard (AES) engine 3218. The storage controllers 3210 may further include a working memory (not shown) in which the FTL 3214 is loaded. The CPU 3213 may execute the FTL 3214 to control data write and read operations on the NVM 3220.

The host interface 3211 may transmit and receive packets to and from the host 3100. A packet transmitted from the host 3100 to the host interface 3211 may include a command or data to be written to the NVM 3220. A packet transmitted from the host interface 3211 to the host 3100 may include a response to the command or data read from the NVM 3220. The memory interface 3212 may transmit data to be written to the NVM 3220 to the NVM 3220 or receive data read from the NVM 3220. The memory interface 3212 may be configured to comply with a standard protocol, such as Toggle or open NAND flash interface (ONFI).

The FTL 3214 may perform various functions, such as an address mapping operation, a wear-leveling operation, and a garbage collection operation. The address mapping operation may be an operation of converting a logical address received from the host 3100 into a physical address used to actually store data in the NVM 3220. The wear-leveling operation may be a technique for preventing excessive deterioration of a specific block by allowing blocks of the NVM 3220 to be uniformly used. As an example, the wear-leveling operation may be implemented using a firmware technique that balances erase counts of physical blocks. The garbage collection operation may be a technique for ensuring usable capacity in the NVM 3220 by erasing an existing block after copying valid data of the existing block to a new block.

The packet manager 3215 may generate a packet according to a protocol of an interface, which consents to the host 3100, or parse various types of information from the packet received from the host 3100. In addition, the buffer memory 3216 may temporarily store data to be written to the NVM 3220 or data to be read from the NVM 3220. Although the buffer memory 3216 may be a component included in the storage controllers 3210, the buffer memory 3216 may be outside the storage controllers 3210.

The ECC engine 3217 may perform error detection and correction operations on read data read from the NVM 3220. More specifically, the ECC engine 3217 may generate parity bits for write data to be written to the NVM 3220, and the generated parity bits may be stored in the NVM 3220 together with write data. During the reading of data from the NVM 3220, the ECC engine 3217 may correct an error in the read data by using the parity bits read from the NVM 3220 along with the read data, and output error-corrected read data.

The AES engine 3218 may perform at least one of an encryption operation and a decryption operation on data input to the storage controllers 3210 by using a symmetric-key algorithm.

According to example embodiments, in a verify step of a program operation, a memory device may perform a dump operation associated with a next target program state while a bit line is selectively precharged. In this case, a total program time of the memory device may be shortened. Accordingly, a memory device with improved performance, an operation method of the memory device, and a page buffer included in the memory device are provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Example embodiments are not necessarily mutually exclusive. For example, some example embodiments may include one or more features described with reference to one or more figures, and may also include one or more other features described with reference to one or more other figures.

While various example embodiments have been described with reference to embodiments thereof, it will be apparent to those of ordinary skill in the art that various changes and modifications may be made thereto without departing from the spirit and scope of example embodiments as set forth in the following claims.

What is claimed is:

1. A memory device comprising:

a peripheral circuit region including a page buffer and at least one first metal pad; and a memory cell region vertically connected to the peripheral circuit region, and including a plurality of memory cells and at least one second metal pad connected to the at least one first metal pad, wherein the page buffer includes:

a plurality of latches connected with a sensing node;

a switch connected with a first latch of the plurality latches;

a temporary storage node configured to store a value of the first latch through the switch;

a first transistor connected between a power supply voltage and a first node, and configured to operate in response to a level of the temporary storage node;

a second transistor connected between a second node and a ground node, and configured to operate in response to the level of the temporary storage node;

a third transistor connected between the first node and the sensing node, and configured to operate in response to a bit line setup signal; and a fourth transistor connected between the second node and the sensing node, and configured to operate in response to a sensing node ground signal.

2. The memory device of claim 1, wherein the switch comprises a transmission gate including an NMOS transistor and a PMOS transistor that are connected in parallel between the temporary storage node and the first latch.

3. The memory device of claim 1, wherein each of the first and third transistors is a PMOS transistor, and each of the second and fourth transistors is an NMOS transistor.

4. The memory device of claim 1, further comprises:

a fifth transistor connected between the first latch and the ground node, and configured to operate in response to a level of the sensing node; and a sixth transistor connected between the first latch and the ground node, and configured to operate in response to a refresh signal.

5. The memory device of claim 1, wherein, in response to the switch being in a turn-on state, the sensing node is initialized as the third and fourth transistors are simultaneously turned on.

6. The memory device of claim 1, during a bit line is selectively precharged through the first transistor, state information generated by other latches of the plurality of latches is dumped to the first latch.

7. The memory device of claim 1, wherein during a bit line is selectively precharged through the first transistor, the switch is turned-off.

8. The memory device of claim 1, wherein the first latch is configured to store a level of the sensing node.

9. The memory device of claim 8, wherein after the first latch stores the level of the sensing node, the switch is turned-on.

10. The memory device of claim 1, wherein a value of the temporary storage node is dumped to the first latch through the sensing node.

11. The memory device of claim 1, wherein the memory cell region further includes a bit line connected to the plurality of memory cells, and wherein the page buffer is connected to the bit line through the at least one first metal pad and the at least one second metal pad.

12. The memory device of claim 1, wherein the at least one second metal pad and the at least one first metal pad are connected to each other by a Cu-to-Cu bonding.

13. The memory device of claim 1, wherein the memory cell region further comprises a plurality of word lines connected to the plurality of memory cells.

14. The memory device of claim 13, wherein the peripheral circuit region further comprises a row decoder connected to the plurality of word lines.

15. The memory device of claim 14, wherein an operation voltage of the page buffer is higher than an operating voltage of the row decoder.

16. A memory device comprising:

a peripheral circuit region including at least one first metal pad; and a memory cell region vertically connected to the peripheral circuit region, and including a plurality of memory cells and at least one second metal pad connected to the at least one first metal pad, wherein the peripheral circuit region further includes:

a plurality of data latches connected with a sensing node, and configured to store data that is to be stored in a first memory cell of the plurality of memory cells;

a first latch connected with the sensing node;

a temporary storage node;

a switch connected between the first latch and the temporary storage node, and configured to operate in response to a temporary storage node setup signal;

a control logic circuit configured to control a first dump operation from the temporary storage node to the first latch through the sensing node.

17. The memory device of claim 16, wherein the switch comprises a transmission gate including an NMOS transistor and a PMOS transistor that are connected in parallel between the temporary storage node and the first latch.

18. The memory device of claim 16, wherein the control logic circuit is further configured to control a second dump operation from the plurality of data latches to the first latch through the sensing node.

19. The memory device of claim 16, wherein the at least one second metal pad and the at least one first metal pad are connected to each other by a Cu-to-Cu bonding.

20. A memory device comprising:

a peripheral circuit region including a page buffer and at least one first metal pad; and a memory cell region vertically connected to the peripheral circuit region, and including a plurality of memory cells and at least one second metal pad connected to the at least one first metal pad, wherein the page buffer includes:

a sensing node connected with a bit line;

a first latch;

a switch;

a first transistor having a first source connected with a power supply voltage, a first drain connected with a first node, and a first gate connected to the first latch through the switch;

a second transistor having a second source connected with a ground node, a second drain connected with a second node, and a second gate connected with the first latch through the switch;

a third transistor having a third source connected with the first node, a third drain connected with the sensing node, and a third gate connected with a first control signal; and a fourth transistor having a fourth source connected with the second node, a fourth drain connected with the sensing node, and a fourth gate connected with a second control signal.

* * * * *